United States Patent
Nagao et al.

(10) Patent No.: US 11,168,251 B2
(45) Date of Patent: *Nov. 9, 2021

(54) PHOSPHOR THAT INCLUDES CRYSTAL PHASE CONTAINING CERIUM

(71) Applicant: Panasonic Intellectual Property Management Co., Ltd., Osaka (JP)

(72) Inventors: Nobuaki Nagao, Gifu (JP); Mitsuru Nitta, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 376 days.

This patent is subject to a terminal disclaimer.

(21) Appl. No.: 16/169,455

(22) Filed: Oct. 24, 2018

(65) Prior Publication Data

US 2019/0177614 A1 Jun. 13, 2019

(30) Foreign Application Priority Data

Dec. 8, 2017 (JP) .............................. JP2017-236274

(51) Int. Cl.
*C09K 11/77* (2006.01)
*H01L 33/50* (2010.01)
*C09K 11/08* (2006.01)

(52) U.S. Cl.
CPC ...... *C09K 11/7766* (2013.01); *C09K 11/0883* (2013.01); *C09K 11/7721* (2013.01); *C09K 11/7792* (2013.01); *H01L 33/502* (2013.01)

(58) Field of Classification Search
CPC ............ C09K 11/7766; C09K 11/7774; C09K 11/7742; C09K 11/77744; C09K 11/77746; C09K 11/77748; C09K 11/77747

See application file for complete search history.

(56) References Cited

U.S. PATENT DOCUMENTS 10,214,429 B2 * 2/2019 Nitta .................. F21S 41/16
11,036,120 B2 * 6/2021 Nagao ................ C09K 11/62
(Continued)

FOREIGN PATENT DOCUMENTS

EP 2264762 A2 12/2010
JP 2006-008721 1/2006
(Continued)

OTHER PUBLICATIONS

Yongchao Jia et al., "First-principles study of Ce3+-doped lanthanum silicate nitride phosphors: Neutral excitation, Stokes shift, and luminescent center identification", Physical Review B93, 155111, Apr. 6, 2016.

(Continued)

*Primary Examiner* — Matthew E. Hoban
(74) *Attorney, Agent, or Firm* — Renner, Otto, Boisselle & Sklar, LLP

(57) ABSTRACT

A phosphor includes a crystal phase with a chemical composition $(Lu_xY_{1-x})_yM_{3-y-z}Ce_z\beta_p\gamma_q$. M denotes one or more elements selected from the group consisting of La, Sc, Pr, Nd, Sm, Eu, Gd, Tb, Dy, Ho, Er, Tm, and Yb. β contains Si, which constitutes 90% or more by mole of β. γ contains N, which constitutes 90% or more by mole of γ. The variables x, y, z, p, and q satisfy $0<x\leq1$, $1.5\leq y\leq3-z$, $0<z\leq0.6$, $5.5\leq p\leq6.5$, and $10.5\leq q\leq11.5$. The phosphor has an emission spectrum peak at a wavelength in the range of not less than 600 nm and not more than 680 nm.

19 Claims, 15 Drawing Sheets

(56) References Cited

U.S. PATENT DOCUMENTS

2003/0094893 A1    5/2003  Ellens et al.
2019/0153316 A1*   5/2019  Liu .................... C09K 11/0883

FOREIGN PATENT DOCUMENTS

| JP | 2008-088362 | | 4/2008 |
|----|----|----|----|
| WO | 2018/001369 | A1 | 1/2018 |
| WO | WO2018001369 | * | 1/2018 |

OTHER PUBLICATIONS

The Extended European Search Report dated Jun. 12, 2019 for the related European Patent Application No. 18208426.9.

* cited by examiner

PHOSPHOR THAT INCLUDES CRYSTAL PHASE CONTAINING CERIUM

BACKGROUND

1. Technical Field

The present disclosure relates to a phosphor and a light-emitting apparatus.

2. Description of the Related Art

In recent years, solid-state light sources, such as white-light-emitting diodes (LEDs) and laser-excited light sources, have been widely used. Existing typical white LEDs include a combination of a blue LED chip, which is a blue-light-emitting device, and a phosphor. In such typical white LEDs, light from a blue LED chip is partly subjected to color conversion with a phosphor, and blue light from the blue LED chip and light from the phosphor are mixed to produce white light. In more recent years, high-power white-light-emitting apparatuses including a combination of a laser diode (LD) and a phosphor have been developed. At present, solid-state white-light sources mainly include a combination of a blue LED chip or a blue LD and a yellow phosphor. In order to improve color rendering properties and color reproducibility or in order to produce low-color-temperature white, white-light sources including a red phosphor in addition to a blue light source and a yellow phosphor are being developed.

Yellow phosphors containing Ce as a luminescent center, such as represented by the general formula $Y_3Al_5O_{12}:Ce^{3+}$ (hereinafter abbreviated to YAG:Ce) or represented by the general formula $La_3Si_6N_{11}:Ce^{3+}$ (hereinafter abbreviated to LSN:Ce) described in Japanese Patent No. 4459941, are known. Also known are red phosphors containing Eu as a luminescent center, such as represented by the general formula $(Sr, Ca)AlSiN_3:Eu^{2+}$ (hereinafter abbreviated to CASN:Eu) described in Japanese Patent No. 3837588.

SUMMARY

One non-limiting and exemplary embodiment provides a phosphor containing Ce as a luminescent center.

In one general aspect, the techniques disclosed here feature a phosphor containing a crystal phase with the chemical composition $(Lu_xY_{1-x})_yM_{3-y-z}Ce_z\beta_p\gamma_q$. M denotes one or more elements selected from the group consisting of La, Sc, Pr, Nd, Sm, Eu, Gd, Tb, Dy, Ho, Er, Tm, and Yb. $\beta$ contains Si, which constitutes 90% or more by mole of $\beta$. $\gamma$ contains N, which constitutes 90% or more by mole of $\gamma$. The variables x, y, z, p, and q satisfy $0<x\leq1$, $1.5\leq y\leq 3-z$, $0<z\leq0.6$, $5.5\leq p\leq6.5$, and $10.5\leq q\leq11.5$. The phosphor has an emission spectrum peak at a wavelength in the range of not less than 600 nm and not more than 680 nm.

It should be noted that general or specific embodiments of the present disclosure may be implemented as a phosphor, a device, an apparatus, a system, a vehicle, a method, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1A:
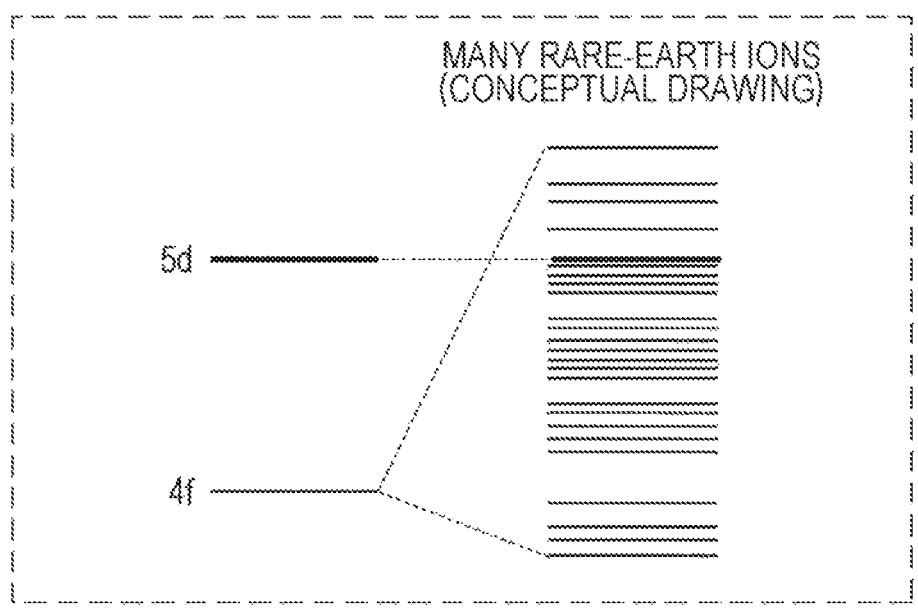
FIG. 1A is a conceptual diagram of splitting of the 4f orbital and the 5d orbital of rare-earth ions.

Underlying Knowledge Forming Basis of the Present Disclosure

LED white-light-emitting apparatuses may include the following apparatuses.

A first apparatus is a pseudo white-light source including a combination of a blue LED and a yellow phosphor YAG:Ce. A light-emitting apparatus of this type is widely used because of its lower power consumption and high drive controllability of the LED. Only having two color components, however, such a white-light source cannot produce warm light, for example, of the incandescent lamp color, and has poor color controllability.

A second apparatus is a white-light source including a combination of a blue LED, a yellow phosphor YAG:Ce, and a red phosphor CASN:Eu. A light-emitting apparatus of this type can produce white light composed of three color components and can control the light intensity of each color component to produce any white light. Thus, a light-emitting apparatus of this type has higher color controllability than light-emitting apparatuses with two color components as described above. The yellow phosphor YAG:Ce used in such a light-emitting apparatus has high emission quantum efficiency, and has almost constant emission quantum efficiency even when excited by a high-power blue LED or blue LD. By contrast, the red phosphor CASN:Eu has a problem of decreased emission quantum efficiency when excited by high-power light and is therefore used only in relatively low power light sources. This is because phosphors containing Eu as a luminescent center have a longer emission lifetime than phosphors containing Ce as a luminescent center and therefore tends to reach luminance saturation during high-energy excitation. Thus, no high-power color-controllable white-light source has been developed.

Thus, the present inventors have extensively studied red phosphors containing Ce as a luminescent center to develop a high-power color-controllable white-light-emitting apparatus.

Summary of Aspect of Present Disclosure

A phosphor according to a first aspect of the present disclosure contains a crystal phase with the chemical composition $(Lu_xY_{1-x})_yM_{3-y-z}Ce_z\beta_p\gamma_q$. M denotes one or two or more elements selected from the group consisting of La, Sc, Pr, Nd, Sm, Eu, Gd, Tb, Dy, Ho, Er, Tm, and Yb. $\beta$ contains Si, which constitutes 90% or more by mole of $\beta$. $\gamma$ contains N, which constitutes 90% or more by mole of $\gamma$. The variables x, y, z, p, and q satisfy $0<x\le1$, $1.5\le y\le3-z$, $0<z\le0.6$, $5.5\le p\le6.5$, and $10.5\le q\le11.5$. A phosphor according to the first aspect has an emission spectrum peak at a wavelength in the range of not less than 600 nm and not more than 680 nm.

The first aspect of the present disclosure can provide a phosphor containing Ce as a luminescent center.

In a second aspect, for example, a phosphor according to the first aspect may have an excitation spectrum peak at a wavelength in the range of not less than 480 nm and not more than 550 nm.

A phosphor according to the second aspect can emit light when irradiated with green excitation light.

In a third aspect, for example, a phosphor according to the second aspect may have a second peak of the excitation spectrum at a wavelength of 350 nm or more and less than 480 nm.

A phosphor according to the third aspect can emit light even when irradiated with excitation light at a shorter wavelength, for example, at 450 nm from a blue LED or at 405 nm from a blue-violet LD, thus offering a wide choice of excitation light sources.

In a fourth aspect, for example, M in a phosphor according to any one of the first to third aspects may contain La, which constitutes 90% or more by mole of M.

A phosphor according to the fourth aspect allows for longer emission wavelength and excitation wavelength.

In a fifth aspect, for example, M in a phosphor according to the fourth aspect may be La, $\beta$ in the phosphor may be Si, and $\gamma$ in the phosphor may be N.

A phosphor according to the fifth aspect allows for longer emission wavelength and excitation wavelength.

In a sixth aspect, for example, x in a phosphor according to any one of the first to fifth aspects may satisfy $0.2\le x\le1$.

A phosphor according to the sixth aspect allows for longer emission wavelength and excitation wavelength.

In a seventh aspect, for example, x in a phosphor according to the sixth aspect may satisfy x=1.

A phosphor according to the seventh aspect allows for longer emission wavelength and excitation wavelength.

In an eighth aspect, for example, y in a phosphor according to any one of the first to seventh aspects may satisfy $2\le y\le3-z$.

A phosphor according to the eighth aspect allows for longer emission wavelength and excitation wavelength.

In a ninth aspect, for example, the crystal phase in a phosphor according to any one of the first to eighth aspects may have a tetragonal crystal structure.

In a tenth aspect, for example, the crystal phase in a phosphor according to any one of the first to ninth aspects may have a 1/e emission lifetime of 100 ns or less.

A phosphor according to the tenth aspect has good luminance saturation characteristics and is therefore a promising red phosphor with high quantum efficiency even in a high-power operation.

In an eleventh aspect, for example, the crystal phase in a phosphor according to any one of the first to tenth aspects may have a crystal structure in which Ce substitutes for at least part of the La(2a) sites in a $La_3Si_6N_{11}$ crystal structure.

A phosphor according to the eleventh aspect can emit light even when irradiated with excitation light at a longer wavelength and is therefore suitably used in combination with a green excitation light source, for example.

In a twelfth aspect, for example, the crystal phase in a phosphor according to any one of the first to eleventh aspects may have a crystal structure in which at least one selected from the group consisting of Lu and Y substitutes for at least part of the La(4c) sites in a $La_3Si_6N_{11}$ crystal structure.

In a phosphor according to the twelfth aspect, at least one selected from the group consisting of Lu and Y substitutes for at least part of the La(4c) sites in the $La_3Si_6N_{11}$ crystal structure and thereby decreases the lattice constants of the a-axis and the b-axis of the crystal lattice and relatively extends the c-axis of the crystal lattice. This can increase lattice distortion, decrease the energy difference between the 4f and 5d orbitals, and increase the emission wavelength.

In a thirteenth aspect, for example, the crystal phase in a phosphor according to the twelfth aspect may have a crystal structure in which at least one selected from the group consisting of Lu and Y substitutes for a majority of the La(4c) sites in a $La_3Si_6N$ crystal structure.

The crystal phase in a phosphor according to the thirteenth aspect has a crystal structure in which Lu or Y substitutes for a majority of the La(4c) sites in a $La_3Si_6N_{11}$ crystal structure. This increases crystal distortion in a phosphor according to the thirteenth aspect and more frequently causes a wavelength shift to a longer wavelength, thus enabling red-light emission.

A light-emitting apparatus according to a fourteenth aspect of the present disclosure includes an excitation light source, which emits light with a wavelength of 600 nm or less, and a first phosphor, which is a phosphor according to any one of the first to thirteenth aspects. The first phosphor is irradiated with the light emitted from the excitation light source and produces fluorescence at a longer wavelength than the light.

With a phosphor according to any one of the first to thirteenth aspects, a light-emitting apparatus according to the fourteenth aspect can have higher quantum efficiency than known light-emitting apparatuses in a high-power operation. Furthermore, when used as a white-light-emitting apparatus, a light-emitting apparatus according to the fourteenth aspect can exhibit good color rendering properties and color reproducibility.

In a fifteenth aspect, for example, the wavelength of the light emitted from the excitation light source in a light-emitting apparatus according to the fourteenth aspect may be in the range of not less than 480 nm and not more than 600 nm.

A light-emitting apparatus according to the fifteenth aspect can efficiently excite a phosphor.

In a sixteenth aspect, for example, the wavelength of the light emitted from the excitation light source in a light-emitting apparatus according to the fourteenth aspect may be in the range of not less than 420 nm and not more than 480 nm.

A light-emitting apparatus according to any one of the fourteenth to sixteenth aspects can use a GaN blue LED or a blue LD as an excitation light source.

In a seventeenth aspect, for example, the excitation light source in a light-emitting apparatus according to any one of the fourteenth to sixteenth aspects may be an LED or LD.

The seventeenth aspect can provide a high-power light-emitting apparatus.

In an eighteenth aspect, for example, a light-emitting apparatus according to any one of the fourteenth to seventeenth aspects may further include a second phosphor, which is irradiated with the light emitted from the excitation light source and produces second fluorescence at a longer wavelength than the light. The second phosphor may have an emission spectrum peak at a wavelength of 480 nm or more and less than 600 nm.

With at least two phosphors with different emission wavelengths, a light-emitting apparatus according to the eighteenth aspect can control emission color.

In a nineteenth aspect, for example, the second phosphor in a light-emitting apparatus according to the eighteenth aspect is a phosphor that emits yellow light as the second fluorescence. The light-emitting apparatus may further include a third phosphor, which is irradiated with the light emitted from the excitation light source and produces third fluorescence at a longer wavelength than the light. The third phosphor may emit green light as the third fluorescence.

With at least two phosphors that emits yellow light and green light, a light-emitting apparatus according to the nineteenth aspect can control emission color.

EMBODIMENTS OF PRESENT DISCLOSURE

Embodiments of the present disclosure will be described in detail below. It should be noted that the present disclosure is not limited to these embodiments, and these embodiments may be appropriately modified without departing from the technical scope of the present disclosure. The same or substantially the same constituents are denoted by the same reference numerals and letters and will not be described again.

First Embodiment

A phosphor according to an embodiment of the present disclosure will be described below, including how the present inventors have developed such a phosphor.
<Principle of Light Emission of Rare-Earth Phosphor>

The following describes how the present inventors have studied the principle of light emission of rare-earth phosphors and have focused on $Ce^{3+}$ phosphors.

The divalent or trivalent ions of Ce, Pr, Nd, Pm, Sm, Eu, Gd, Tb, Dy, Ho, Er, Tm, and Yb of rare-earth elements have a valence electron in the 4f orbital. Most of these rare-earth ions have multiple electrons in the 4f orbital and, as conceptually illustrated in FIG. 1A, lifting of the 4f orbital degeneracy causes large splitting of the 4f orbital. Thus, transition from one 4f level to another 4f level (f-f transition) can be utilized to emit light. Because the f-f transition is forbidden transition, excited electrons characteristically have a long life. Thus, phosphors containing a rare-earth ion are often used as laser media. When such phosphors are used in incoherent light sources, such as general illumination, however, the emission intensity is immediately saturated.

Figure 1B:
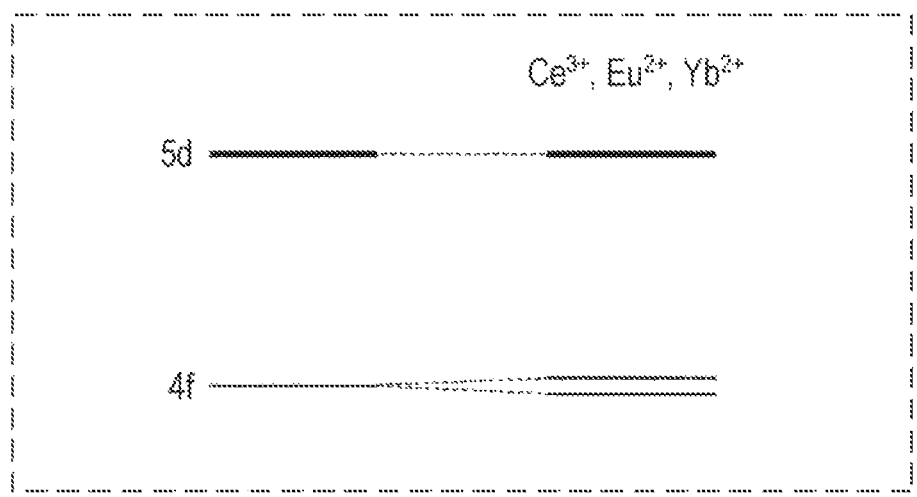
FIG. 1B is a conceptual diagram of splitting of the 4f orbital and the 5d orbital of $Ce^{3+}$, $Eu^{2+}$, and $Yb^{2+}$.

$Ce^{3+}$ has only one valence electron in the 4f orbital. Thus, as conceptually illustrated in FIG. 1B, splitting of the 4f orbital is much smaller in $Ce^{3+}$ than in other rare-earth ions. Exceptionally, energy splitting of the 4f orbital in $Eu^{2+}$ and $Yb^{2+}$ is also small. This is because $Eu^{2+}$ has a semiclosed shell with seven electrons in the 4f orbital, and $Yb^{2+}$ has a closed shell with 14 electrons in the 4f orbital.

Due to the small splitting of the 4f orbital, $Ce^{3+}$, $Eu^{2+}$, and $Yb^{2+}$ have a large energy difference between the 4f ground level and the 5d orbital. Furthermore, there is no 4f orbital with large energy between the 4f ground level and the 5d orbital. Thus, transition between 4f and 5d (4f-5d transition) can be easily utilized.

The 4f-5d transition is allowed transition, and excited electrons therefore have short lives. Thus, excitation immediately induces light emission, and even excitation with strong excitation light is less likely to cause saturation (luminance saturation).

The present inventors have further focused on $Ce^{3+}$ out of $Ce^{3+}$, $Eu^{2+}$, and $Yb^{2+}$. $Ce^{3+}$ has only one electron involved in 4f-5d transition, and the 4f orbitals are completely vacant during transition from the 5d excited state to the 4f ground state; that is, the 4f orbital involved in transition has a high state density. Thus, the present inventors thought that $Ce^{3+}$ has the shortest emission lifetime. By contrast, $Eu^2$ has six electrons in 4f after excitation of an electron to 5d, and $Yb^{2+}$ has 13 electrons remaining in 4f after excitation of an electron to 5d. Thus, $Eu^{2+}$ and $Yb^{2+}$ have a low state density in the 4f orbital and are expected to have a longer emission lifetime than $Ce^{3+}$. Thus, $Ce^{3+}$ phosphors have the shortest emission lifetimes among the rare-earth elements and are less likely to reach luminance saturation. Actually, YAG:Ce has a 1/e emission lifetime of approximately 70 ns, and CASN:Eu has a 1/e emission lifetime in the range of approximately 600 to 800 ns.

On the basis of these considerations, $Ce^{3+}$ phosphors are superior to $Eu^{2+}$ phosphors. Actually, almost all commercially available white LEDs include YAG:Ce. However, CASN:Eu is widely used as a red phosphor. The present inventors think that this is because $Ce^{3+}$ phosphors with red-light emission are difficult to develop, and promising materials have not been found. The reason for that and the principle that determines the emission wavelength will be described below.

<Emission Wavelength of Phosphor>

Phosphors containing $Ce^{3+}$ as a luminescent center and phosphors containing $Eu^{2+}$ as a luminescent center utilize transition from the ground state of the 4f orbital to the excited state of the 5d orbital (4f-5d transition). $Ce^{3+}$ and $Eu^{2+}$ introduced into a host crystal for a phosphor are mainly affected by the nearest bonded anion atom (ligand), and the energy of the 4f and 5d orbitals and the emission wavelength are changed. Thus, the emission wavelength of the phosphor depends on the host crystal.

Figure 2:
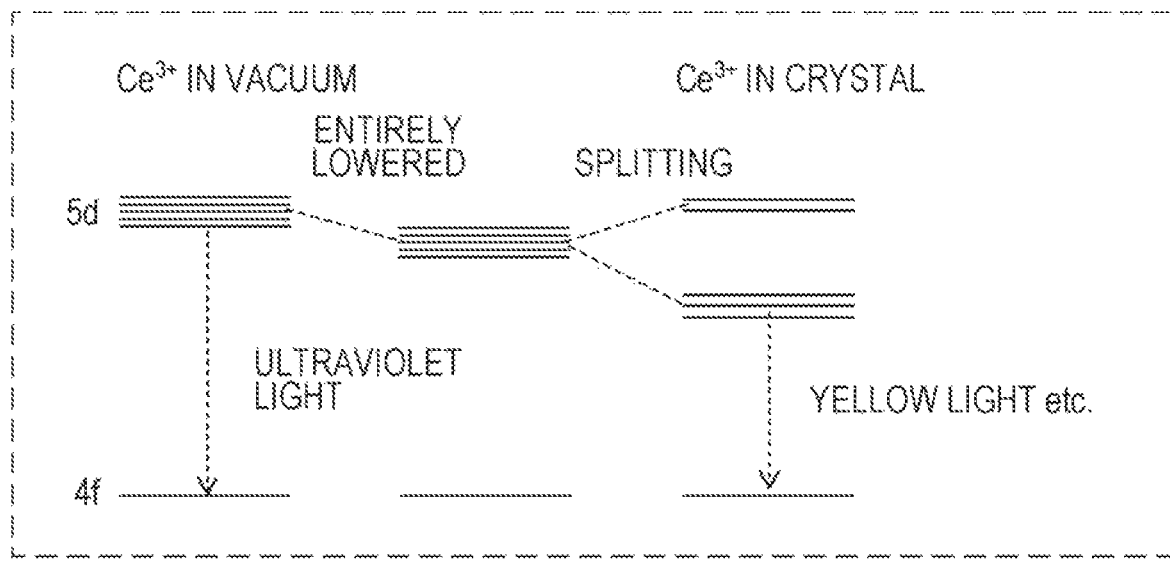
FIG. 2 is an energy level diagram of $Ce^{3+}$ in a vacuum and in a crystal.

The influence of the ligand includes an energy shift of the 4f or 5d orbital and lifting of degeneracy of five levels in the 5d orbital (that is, splitting of the 5d orbital). The energy shift depends greatly on the expansion of the wave function of the 4f or 5d orbital and the positional relationship of the ligand. In the splitting of the 5d orbital, as illustrated in FIG. 2, the 5d orbital splits while the total energy of the five levels of the 5d orbital is maintained. Thus, an increase in the energy of one level is associated with a decrease in the energy of another level. Thus, splitting of the 5d orbital can be enlarged to decrease the lowest energy of the 5d orbital.

As illustrated in FIG. 2, light emission due to 4f-5d transition is caused by transition from the lowest energy level of the 5d orbital to 4f. Thus, $Ce^{3+}$ or $Eu^{2+}$ can be introduced into the crystal to decrease the 4f-5d energy difference and to increase the emission wavelength.

Although $Ce^{3+}$ in a vacuum (that is, not introduced into the crystal) has a large 4f-5d energy difference and emits light in the deep ultraviolet region, $Eu^{2+}$ emits blue light. Thus, $Eu^{2+}$ can emit red light with a smaller long-wavelength shift, and CASN:Eu is practically used. Practically used $Ce^{3+}$ phosphors with the longest wavelength are yellow phosphors YAG:Ce. Practically used $Ce^{3+}$ red phosphors have not been developed.

<Studies by the Present Inventors>

Figure 3:
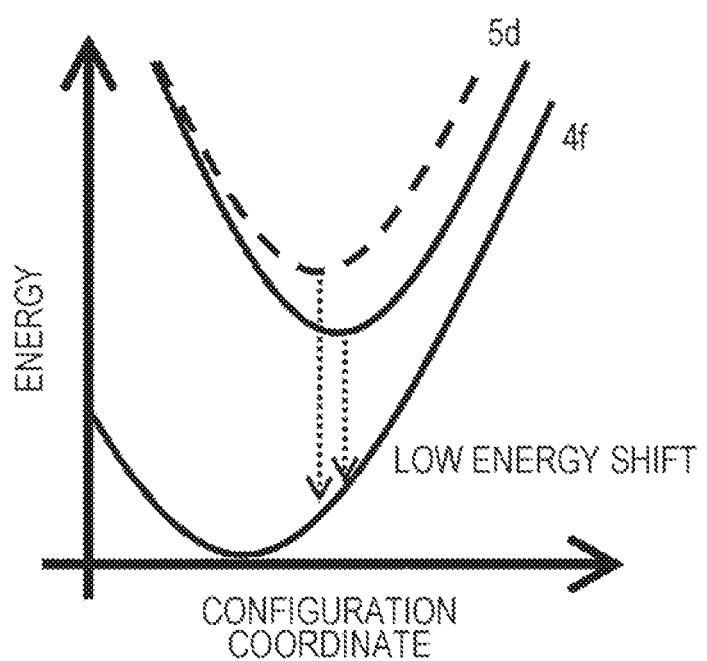
FIG. 3 is a configuration coordinate model diagram of the 4f orbital and the 5d orbital.

The present inventors have conducted studies considering that the 5d orbital or the 4f orbital is needed to be shifted to develop a Ce red phosphor, as illustrated in FIG. 3.

In order to further shift the 5d orbital or the 4f orbital, it should be important for a ligand of $Ce^{3+}$ to satisfy (1) a short ligand distance and (2) low symmetry of the ligand.

Regarding (1), a short ligand distance between $Ce^{3+}$ and its nearest anion results in a large influence of the orbital of the anion on the 4f orbital, the 5d orbital, or both and a large energy shift of the 4f orbital, the 5d orbital, or both. This results in an increase in the energy of the 4f orbital or a decrease in the lowest energy level of the 5d orbital due to large splitting of the 5d orbital. These effects decrease the 4f-5d energy difference. Regarding (2), low symmetry of the ligand results in stabilization of the 5d orbital, which has a wave function extending in a direction in which no ligand exists. This decreases the 4f-5d energy difference.

On the basis of these guidelines, the present inventors have searched for a new material. More specifically, the present inventors examined the calculation of the emission wavelength by crystal structure simulation. Through these approaches, the present inventors have found new red phosphors that exhibit red. These approaches will be described below.

<Calculation of Emission Wavelength of Ce Phosphor>

In order to determine the relationship between the emission wavelength and the excitation wavelength of a phosphor containing Ce as a luminescent center, the present inventors simulated the relationship between the emission wavelength and the excitation wavelength of various crystals doped with Ce. The results and discussion of the crystal structure simulation will be described below.

The present inventors calculated the emission wavelength using a technique described in the literature "Y Jia et al., Physical Review B 93, 155111 (2016)". In the technique, the excitation wavelength is calculated from the difference between the total energy at the equilibrium point of the ground state and the total energy of the excited state on the atomic coordinates. In the technique, the emission wavelength is calculated from the difference between the total energy at the equilibrium point at which the excited state is relaxed and the total energy of the ground state on the atomic coordinates. According to the literature, the calculated emission wavelengths and excitation wavelengths of three phosphors YAG:Ce, $LaSi_3N_5$:Ce, and $La_3Si_6N_{11}$:Ce agree well with experimental values. The present inventors calculated the emission wavelength and the excitation wavelength of $YAlO_3$:Ce as well as $LaSi_3N_5$:Ce and $La_3Si_6N_{11}$:Ce and confirmed that the calculation can precisely reproduce the experimental results as in the literature. Table 1 lists the excitation wavelength and the emission wavelength of each phosphor determined by the simulation.

TABLE 1

| Chemical composition | (Y, Ce) $AlO_3$ | (La, Ce) $Si_3N_5$ | $(La_3, Ce)$ $Si_6N_{11}$ |
| --- | --- | --- | --- |
| Excitation wavelength (nm) | 310 | 366 | 470 |
| Emission wavelength (nm) | 349 | 445 | 543 |

<New composition $(La, Lu, Y)_3Si_6N_{11}$:Ce Phosphor>

First, the present inventors intended to substitute $Lu^{3+}$ for a $La^{3+}$ site in $La_3Si_6N_{11}$:Ce to shorten the ligand distance.

$Lu^{3+}$ has a smaller ionic radius than $La^{3+}$. Thus, substitution of $Lu^{3+}$ for a $La^{3+}$ site can decrease the lattice constant. A decrease in lattice constant is expected to shorten the ligand distance.

A new composition $(La, Lu, Y)_3Si_6N_{11}$:Ce phosphor was studied by the calculation technique. A phosphor of this composition includes substitution of $Lu^{3+}$ or $Lu^{3+}$ and $Y^{3+}$ for a $La^3$ site in $La_3Si_6N_{11}$:Ce. A smaller ionic radius of $Lu^{3+}$ and $Y^{3+}$ than $La^{3+}$ results in a smaller ligand distance of $Ce^{3+}$ in $(La, Lu, Y)_3Si_6N_{11}$ than in $La_3Si_6N_{11}$, thus resulting in a stronger ligand field. This potentially increases the crystal lattice distortion and the emission wavelength.

Figure 4:
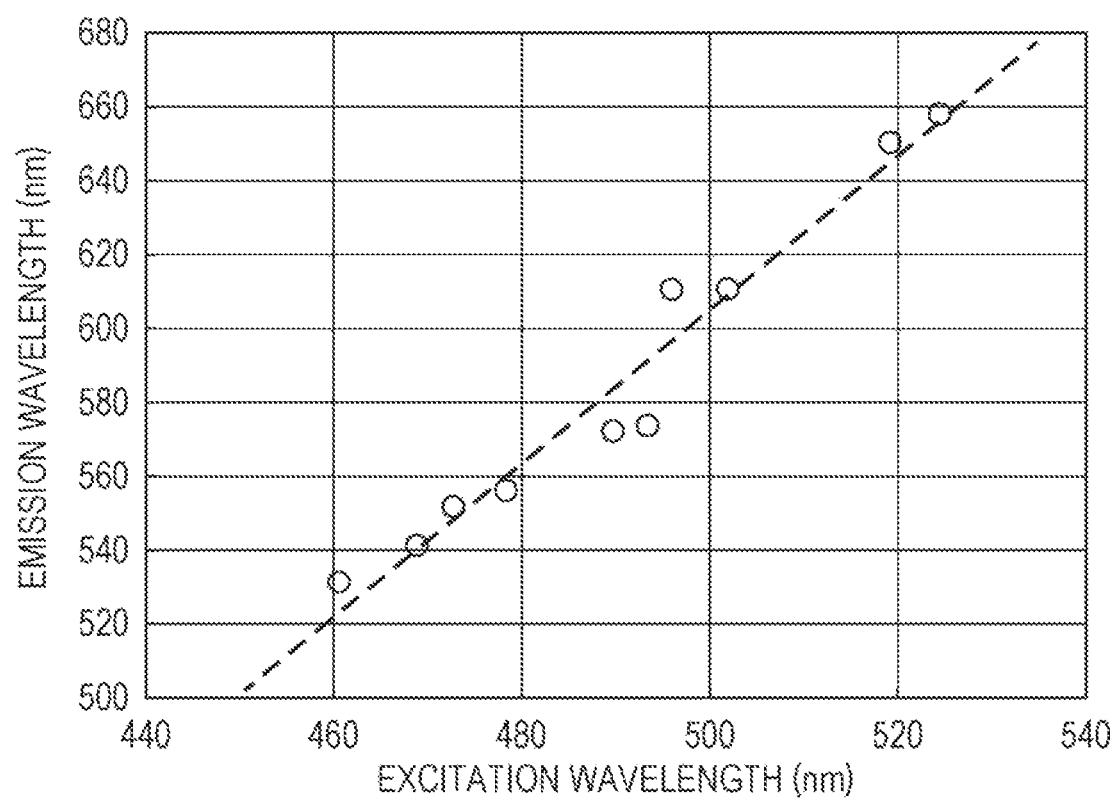
FIG. 4 is a graph showing the relationship between the excitation wavelength and the emission wavelength in a (La, Lu)$_3$Si$_6$N$_{11}$:Ce phosphor.
Figure 5:
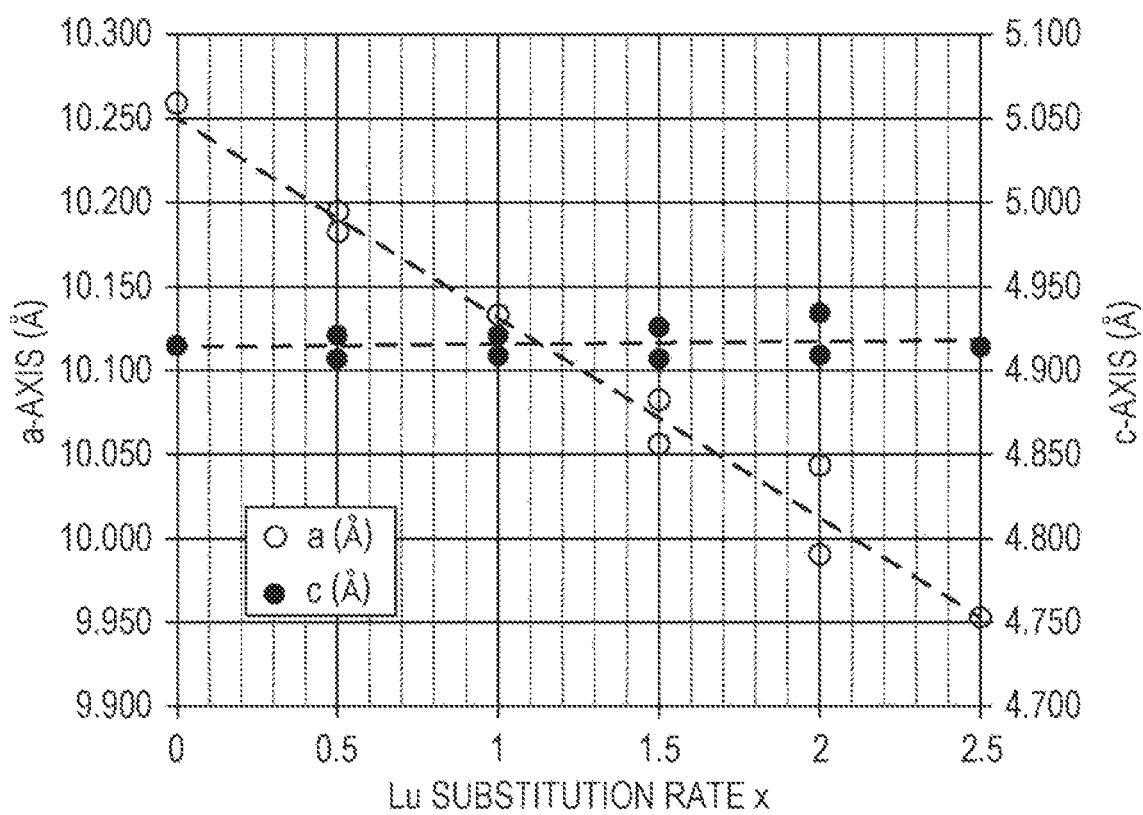
FIG. 5 is a graph showing the relationship between the $Lu^{3+}$ substitution rate x and the lattice constant of the a-axis and the relationship between the $Lu^{3+}$ substitution rate x and the lattice constant of the c-axis in a (La, Lu)$_3$Si$_6$N$_{11}$:Ce phosphor.
Figure 6A:
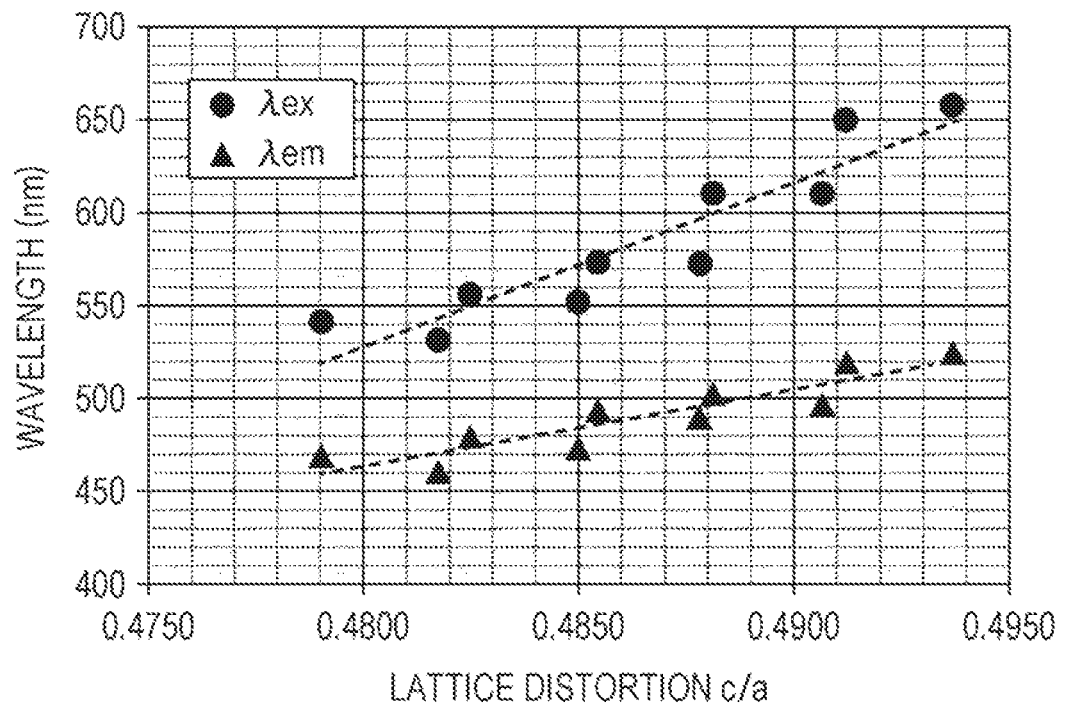
FIG. 6A is a graph showing the relationship between the lattice distortion c/a and the excitation wavelength $\lambda_{ex}$ and the relationship between the lattice distortion c/a and the emission wavelength $\lambda_{em}$ in a (La, Lu)$_3$Si$_6$N$_{11}$:Ce phosphor.
Figure 6B:
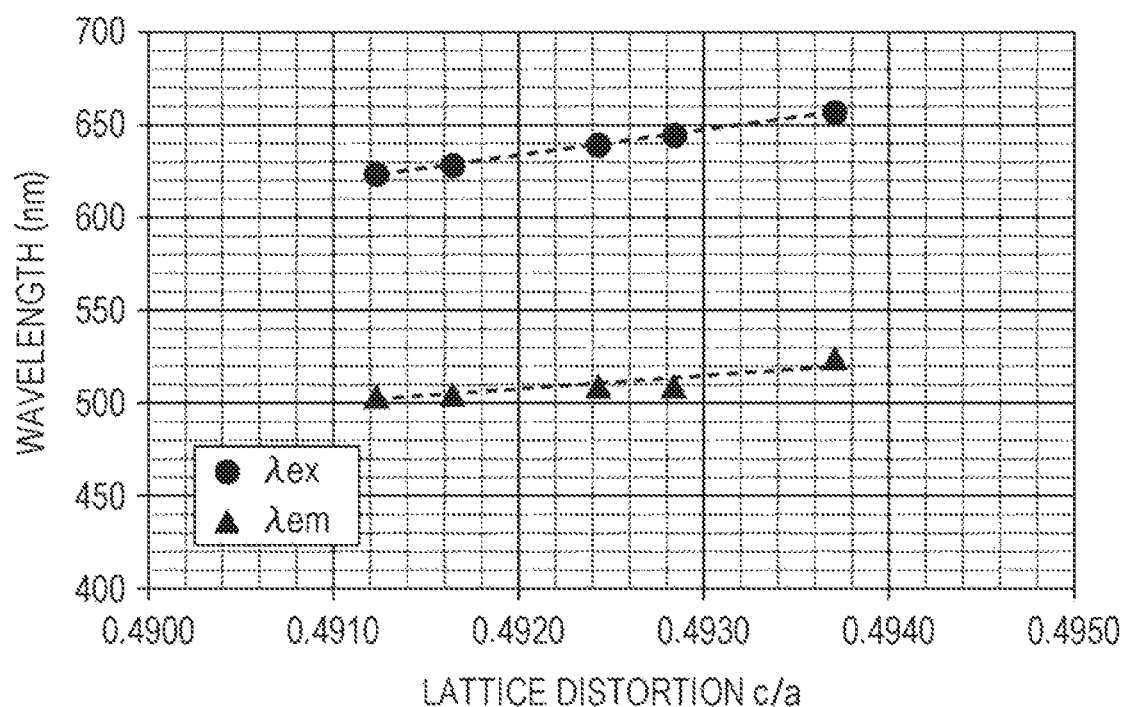
FIG. 6B is a graph showing the relationship between the lattice distortion c/a and the excitation wavelength $\lambda_{ex}$ and the relationship between the lattice distortion c/a and the emission wavelength $\lambda_{em}$ in a (Lu, Y)$_3$Si$_6$N$_{11}$:Ce phosphor.
Figure 7:
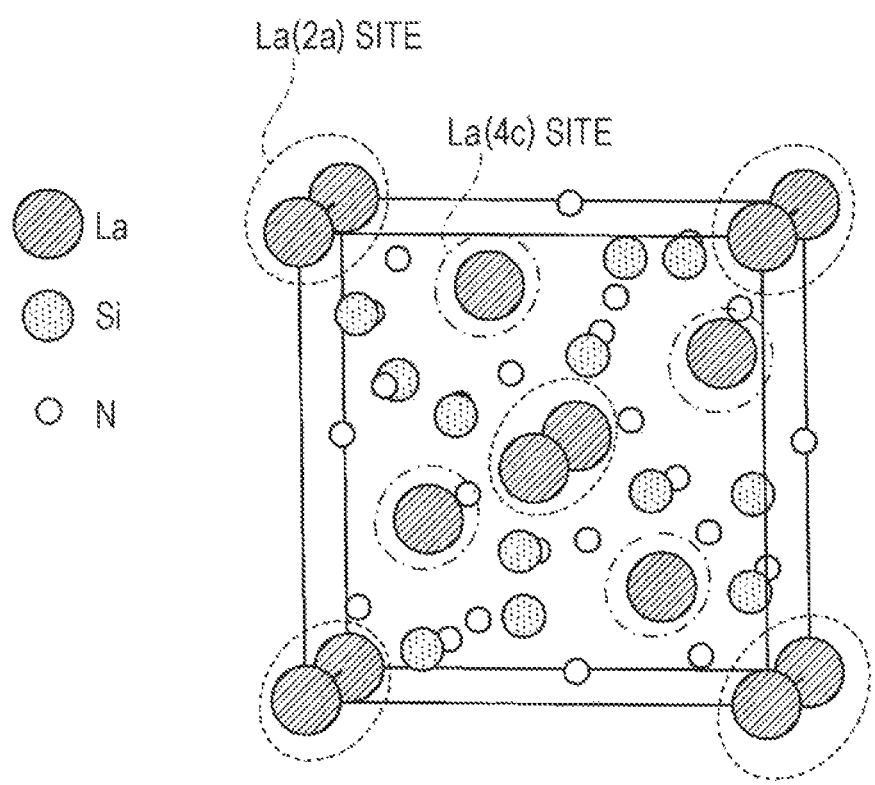
FIG. 7 is a schematic view of a La$_3$Si$_6$N$_{11}$ crystal structure and two different sites of La.
Figure 8A:
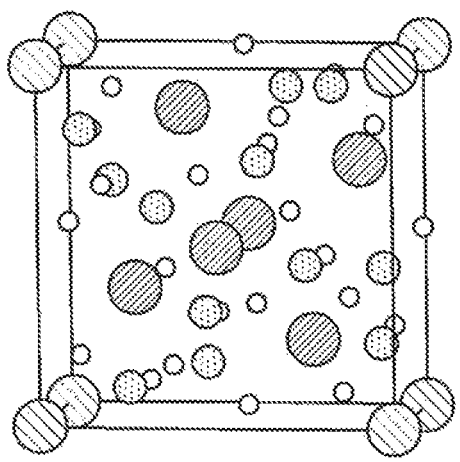
FIG. 8A is a schematic view of the crystal structure of a sample No. 1 of the (La, Lu)$_3$Si$_6$N$_{11}$:Ce phosphor.
Figure 8B:
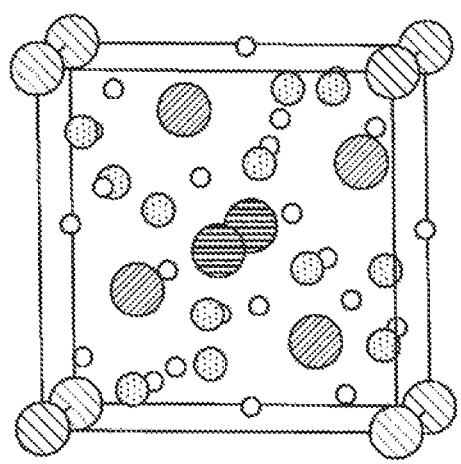
FIG. 8B is a schematic view of the crystal structure of a sample No. 2 of the (La, Lu)$_3$Si$_6$N$_{11}$:Ce phosphor.
Figure 8C:
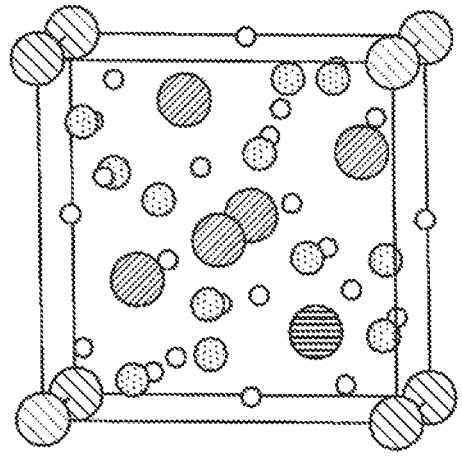
FIG. 8C is a schematic view of the crystal structure of a sample No. 3 of the (La, Lu)$_3$Si$_6$N$_{11}$:Ce phosphor.
Figure 8D:
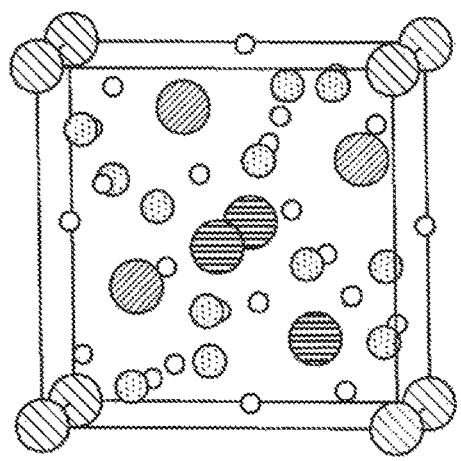
FIG. 8D is a schematic view of the crystal structure of a sample No. 4 of the (La, Lu)$_3$Si$_6$N$_{11}$:Ce phosphor.
Figure 8E:
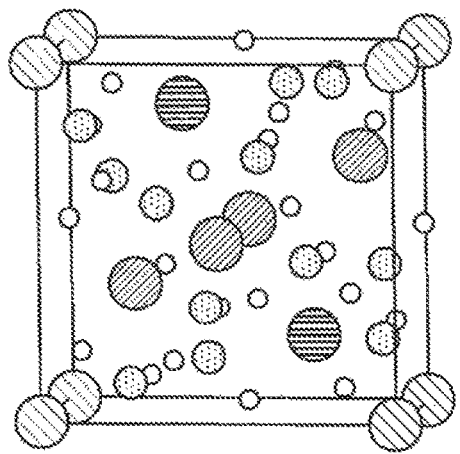
FIG. 8E is a schematic view of the crystal structure of a sample No. 5 of the (La, Lu)$_3$Si$_6$N$_{11}$:Ce phosphor.
Figure 8F:
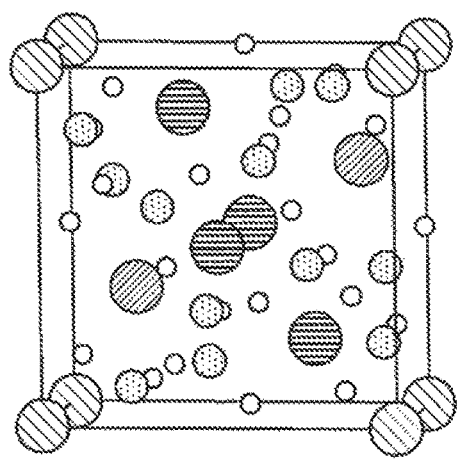
FIG. 8F is a schematic view of the crystal structure of a sample No. 6 of the (La, Lu)$_3$Si$_6$N$_{11}$:Ce phosphor.
Figure 8G:
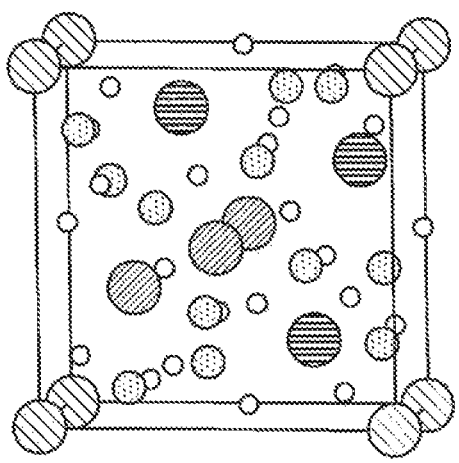
FIG. 8G is a schematic view of the crystal structure of a sample No. 7 of the (La, Lu)$_3$Si$_6$N$_{11}$:Ce phosphor.
Figure 8H:
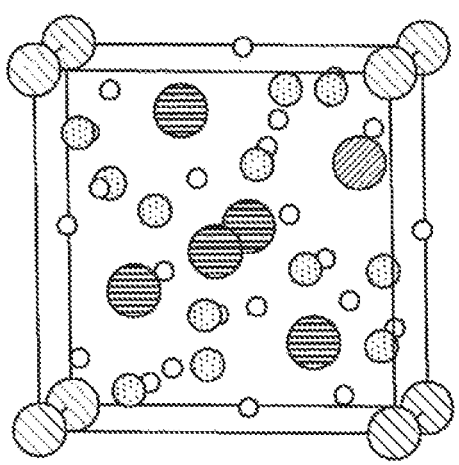
FIG. 8H is a schematic view of the crystal structure of a sample No. 8 of the (La, Lu)$_3$Si$_6$N$_{11}$:Ce phosphor.
Figure 8I:
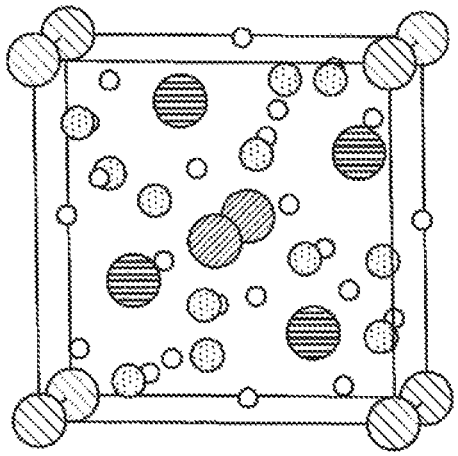
FIG. 8I is a schematic view of the crystal structure of a sample No. 9 of the (La, Lu)$_3$Si$_6$N$_{11}$:Ce phosphor.
Figure 8J:
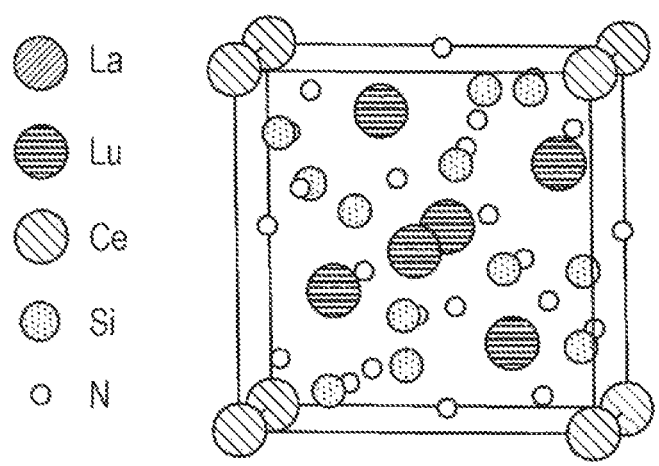
FIG. 8J is a schematic view of the crystal structure of a sample No. 10 of the (La, Lu)$_3$Si$_6$N$_{11}$:Ce phosphor.
Figure 9:
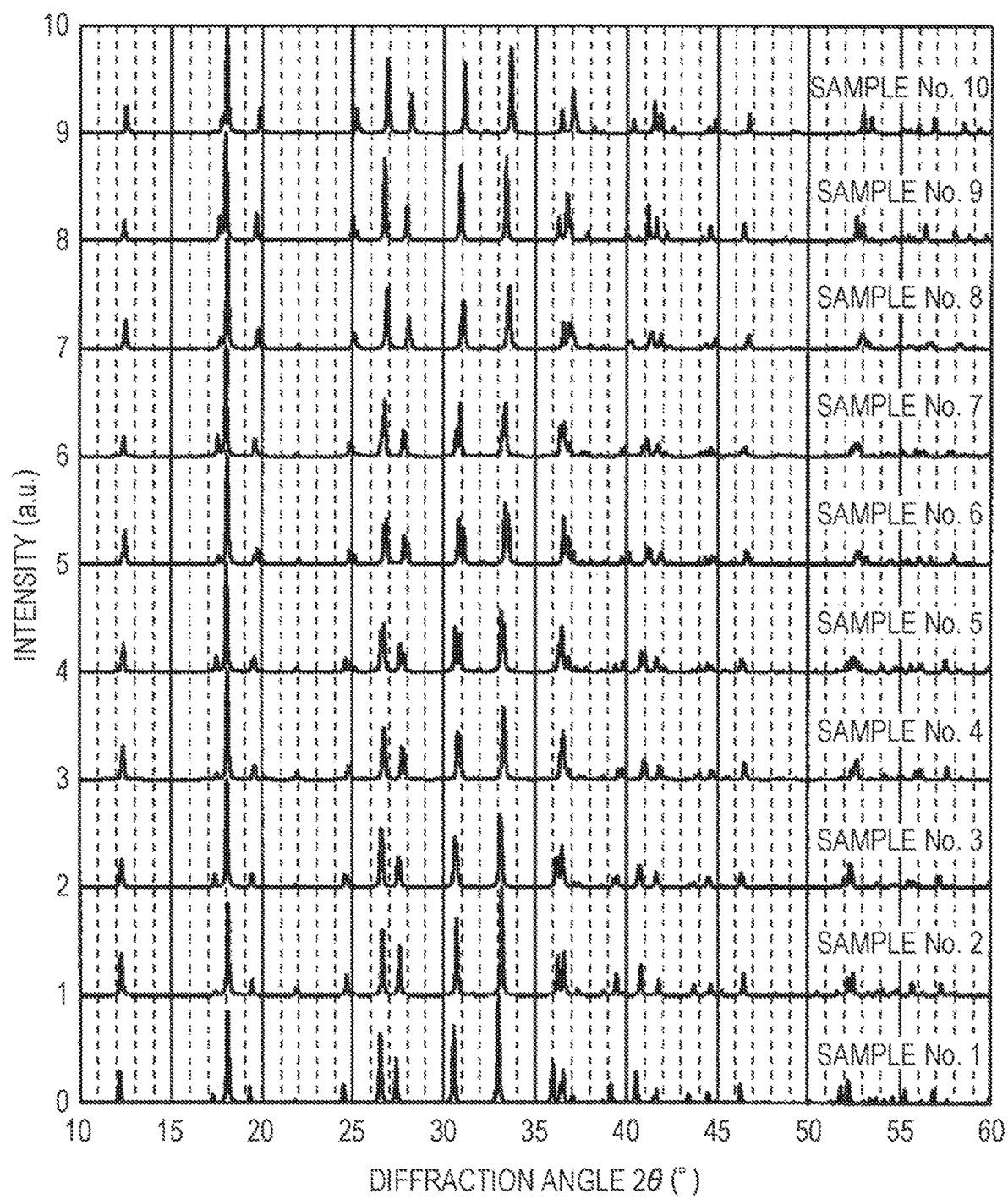
FIG. 9 is a graph of powder XRD diffraction patterns derived from the crystal structures of the phosphors of the samples No. 1 to No. 10 shown in FIGS. 8A to 8J.

Table 2 lists the calculation results of the lattice distortion c/a, which is the lattice constant ratio of the c-axis to the a-axis, the excitation wavelength $\lambda_{ex}$, and the emission wavelength $\lambda_{em}$ for different $Lu^{3+}$ substitution rates in a $(La, Lu)_3Si_6N_{11}$:Ce phosphor. Table 3 lists the calculation results of the lattice distortion c/a, which is the lattice constant ratio of the c-axis to the a-axis, the excitation wavelength $\lambda_{ex}$, and the emission wavelength $\lambda_{em}$ for different $Y^{3+}$ substitution rates in a $(Lu, Y)_3Si_6N_{11}$:Ce phosphor. FIG. 4 is a graph showing the relationship between the excitation wavelength and the emission wavelength. FIG. 5 shows the relationship between the $Lu^{3+}$ substitution rate x and the lattice constant of the a-axis and the relationship between the $Lu^{3+}$ substitution rate x and the lattice constant of the c-axis in a $(La, Lu)_3Si_6N_{11}$:Ce phosphor. FIG. 6A shows the relationship between the lattice distortion c/a and the excitation wavelength $\lambda_{ex}$ and the relationship between the lattice distortion c/a and the emission wavelength $\lambda_{em}$ in a $(La, Lu)_3Si_6N_{11}$:Ce phosphor. FIG. 6B shows the relationship between the lattice distortion c/a and the excitation wavelength $\lambda_{ex}$ and the relationship between the lattice distortion c/a and the emission wavelength $\lambda_{em}$ in a (Lu, Y)$_3$Si$_6$N$_{11}$:Ce phosphor. FIG. 7 illustrates a La$_3$Si$_6$N$_{11}$ crystal structure and two different sites of La. In FIG. 7, La(2a) sites are indicated by broken lines, and La(4c) sites are indicated by dash-dotted lines. FIGS. 8A to 8J illustrate the crystal structures of samples No. 1 to No. 10. FIG. 9 shows powder XRD diffraction patterns calculated from the crystal structures of the samples No. 1 to No. 10. The symbol * in Table 2 shows that the sample is a comparative example. In the column "Lu substitution site and substitution rate" in Table 2, the Lu substitution site and the Lu substitution rate are represented by "Lu substitution site←Lu substitution rate". In the column "Y substitution site and substitution rate" in Table 3, the Y substitution site and the Y substitution rate are represented by "Y substitution site←Y substitution rate".

however, the excitation wavelength is 504 nm, and the emission wavelength is 625 nm. Thus, green excitation light causes red-light emission.

Thus, substitution of Lu$^{3+}$ or Lu$^{3+}$ and Y$^3$ for a La$^3$ site in La$_3$Si$_6$N$_{11}$:Ce can increase the excitation wavelength and the emission wavelength. A phosphor that can emit red light at a wavelength of 600 nm or more may be a (La, Lu)$_3$Si$_6$N$_{11}$:Ce phosphor in which a majority of the La(4c) sites in the La$_3$Si$_6$N$_{11}$ crystal structure are substituted with at least one selected from the group consisting of Lu and Y.

Eu$^{2+}$ has a much longer emission lifetime than Ce$^{3+}$. The emission lifetime correlates with the 4f-5d transition probability of Eu$^{2+}$ and Ce$^{3+}$, and a longer emission lifetime results in a lower transition probability. Thus, the excitation probability of 4f-5d transition of Eu$^{2+}$ is much lower than

TABLE 2

| Sample No. | Composition formula | Lu substitution site and substitution rate | c/a | $\lambda_{ex}$ (nm) | $\lambda_{em}$ (nm) |
|---|---|---|---|---|---|
| *1 | (La$_{2.5}$, Ce$_{0.5}$)Si$_6$N$_{11}$ | — | 0.4791 | 470 | 543 |
| *2 | (La$_2$, Lu$_{0.5}$, Ce$_{0.5}$)Si$_6$N$_{11}$ | La(2a)←Lu0.5 | 0.4818 | 461 | 531 |
| *3 | (La$_2$, Lu$_{0.5}$, Ce$_{0.5}$)Si$_6$N$_{11}$ | La(4c)←Lu0.5 | 0.4825 | 478 | 556 |
| *4 | (La$_{1.5}$, Lu$_1$, Ce$_{0.5}$)Si$_6$N$_{11}$ | La(2a)←Lu0.5, La(4c)←Lu0.5 | 0.4850 | 473 | 552 |
| *5 | (La$_{1.5}$, Lu$_1$, Ce$_{0.5}$)Si$_6$N$_{11}$ | La(4c)←Lu1 | 0.4855 | 493 | 574 |
| *6 | (La$_1$, Lu$_{1.5}$, Ce$_{0.5}$)Si$_6$N$_{11}$ | La(2a)←Lu0.5, La(4c)←Lu1 | 0.4879 | 490 | 572 |
| 7 | (La$_1$, Lu$_{1.5}$, Ce$_{0.5}$)Si$_6$N$_{11}$ | La(4c)←Lu1.5 | 0.4882 | 502 | 610 |
| 8 | (La$_{0.5}$, Lu$_2$, Ce$_{0.5}$)Si$_6$N$_{11}$ | La(2a)←Lu0.5, La(4c)←Lu1.5 | 0.4907 | 496 | 610 |
| 9 | (La$_{0.5}$, Lu$_2$, Ce$_{0.5}$)Si$_6$N$_{11}$ | La(4c)←Lu2 | 0.4913 | 519 | 650 |
| 10 | (Lu$_{2.5}$, Ce$_{0.5}$)Si$_6$N$_{11}$ | La(2a)←Lu0.5, La(4c)←Lu2 | 0.4937 | 525 | 658 |

Table 2 and FIG. 4 show that the emission wavelength tends to increase with the Lu$^{3+}$ substitution rate in the (La, Lu)$_3$Si$_6$N$_{11}$:Ce phosphors. The excitation peak wavelength also increases with the emission wavelength. In the compositions of the samples 7 to 10 that emit red light at an emission wavelength of 600 nm or more, the peak excitation wavelength is in a green region of 490 nm or more. As is clear from FIG. 5, an increase in Lu$^{3+}$ substitution rate results in a decrease in the lattice constant of the a-axis and an increase in the lattice constant of the c-axis. As is clear from Table 2 and FIG. 6A, the lattice distortion c/a, which is the lattice constant ratio of the c-axis to the a-axis, increases with the Lu$^{3+}$ substitution rate, and the emission wavelength and the excitation wavelength increase with the lattice distortion c/a. These results show that substitution of Lu for La increases crystal lattice asymmetry, increases the splitting width of the 5d orbital of Ce$^{3+}$, and decreases the energy difference between the 5d orbital and the 4f orbital, thus increasing the emission wavelength and the excitation wavelength.

the excitation probability of 4f-5d transition of Ce$^{3+}$. However, the 5d excitation level of Eu$^{2+}$ is likely to overlap the conduction band of the base material ((La,Y)$_3$Si$_6$N$_{11}$). This enables efficient energy absorption between the 4f ground level of Eu$^{2+}$ and the conduction band of the base material. The absorbed energy corresponds to energy in the blue light region. Eu$^{2+}$ has seven electrons in the 4f orbital. Each of the electrons has a wide energy level, and Eu$^{2+}$ therefore has a broad excitation wavelength. Thus, a red phosphor containing Eu$^{2+}$ as a luminescent center has a broad excitation wavelength with a peak in the blue region. Thus, a light source containing a red phosphor with the Eu$^{2+}$ luminescent center includes an excitation light source that can emit blue light having the highest absorption efficiency.

By contrast, the 5d excitation level of a phosphor containing Ce$^{3+}$ as a luminescent center is less likely to overlap the conduction band of the base material. Energy absorption between the 4f ground level and the conduction band of the base material is therefore not expected. Thus, 4f-5d transition is main energy absorption.

TABLE 3

| Sample No. | Composition formula | Y substitution site and substitution rate | c/a | $\lambda_{ex}$ (nm) | $\lambda_{em}$ (nm) |
|---|---|---|---|---|---|
| 10 | (Lu$_{2.5}$, Ce$_{0.5}$)Si$_6$N$_{11}$ | — | 0.4937 | 525 | 658 |
| 11 | (Lu$_2$, Y$_{0.5}$, Ce$_{0.5}$)Si$_6$N$_{11}$ | Lu(4c)←Y0.5 | 0.4928 | 510 | 645 |
| 12 | (Lu$_{1.5}$, Y$_1$, Ce$_{0.5}$)Si$_6$N$_{11}$ | Lu(4c)←Y1 | 0.4924 | 510 | 640 |
| 13 | (Lu$_1$, Y$_{1.5}$, Ce$_{0.5}$)Si$_6$N$_{11}$ | Lu(4c)←Y1.5 | 0.4916 | 505 | 629 |
| 14 | (Lu$_{0.5}$, Y$_2$, Ce$_{0.5}$)Si$_6$N$_{11}$ | Lu(4c)←Y1.5, Lu(2a)←Y0.5 | 0.4912 | 504 | 625 |

Table 3 and FIG. 6B show that in a Lu$_3$Si$_6$N$_{11}$:Ce phosphor in which Y substitutes for part of Lu, an increase in Y substitution rate results in a slight decrease in lattice distortion c/a and causes a shift of the excitation wavelength and the emission wavelength to a shorter wavelength. Even when 4 sites out of 5 sites of Lu are substituted with Y, The present inventors proved from the results that the energy difference in 4f-5d transition of a red phosphor with Ce$^{3+}$ corresponds to the energy difference in the green light region. Thus, a red phosphor with Ce$^{3+}$ has higher absorption efficiency with an excitation light source of green light than with an excitation light source of blue light. The use of green light can increase light output. A method for converting green light to red light according to the present application can have a smaller energy conversion loss (e.g., Stokes' loss) and can emit higher-power light than a known method for converting blue light to red light.

Phosphor According to First Embodiment

On the basis of these results, the present inventors have developed a new red phosphor containing a crystal phase with the chemical composition $(Lu_xY_{1-x})_yM_{3-y-z}Ce_z\beta_p\gamma_q$ as a phosphor according to one embodiment of the present disclosure. M denotes one or two or more elements selected from the group consisting of La, Sc, Pr, Nd, Sm, Eu, Gd, Tb, Dy, Ho, Er, Tm, and Yb. β contains Si, which constitutes 90% or more by mole of β. γ contains N, which constitutes 90% or more by mole of γ. The variables x, y, z, p, and q satisfy $0<x\leq1$, $1.5\leq y\leq3-z$, $0<z\leq0.6$, $5.5\leq p\leq6.5$, and $10.5\leq q\leq11.5$. A phosphor according to the first embodiment will be further described below.

As described above, in the chemical composition of a phosphor according to the first embodiment, z satisfies $0<z\leq0.6$. Since z is more than 0, Ce can emit light. In order to increase emission intensity, z is desirably 0.0003 or more, more desirably 0.015 or more. The maximum value of z is not particularly limited as long as the phosphor can emit light. However, an excessively large z results in low emission intensity due to concentration quenching. Thus, the decrease in emission intensity can be reduced when z is 0.6 or less. In order to increase emission intensity, z is desirably 0.3 or less, more desirably 0.15 or less.

In a phosphor according to the first embodiment, in order to increase the emission wavelength and the excitation wavelength, it is desirable to increase the Lu or Lu and Y substitution rate for La. Thus, in the chemical composition of a phosphor according to the present embodiment, y and z satisfy $1.5\leq y\leq(3-z)$, desirably $2\leq y\leq(3-z)$.

As described above, in the chemical composition of a phosphor according to the first embodiment, x satisfies $0<x\leq1$. In order to increase the emission wavelength and the excitation wavelength, x desirably satisfies $0.2<x\leq1$, more desirably x=1.

In the chemical composition of a phosphor according to the first embodiment, M may contain La, which constitutes 90% or more by mole of M. M may be La, β may be Si, and γ may be N. Thus, a phosphor according to the first embodiment may contain a crystal phase with the chemical composition $(Lu_xY_{1-x})_yLa_{3-y-z}Ce_zSi_pN_q$.

A phosphor according to the first embodiment has an emission spectrum peak at a wavelength in the range of not less than 600 nm and not more than 680 nm, for example. A phosphor according to the first embodiment may have an emission spectrum peak at a wavelength of 610 nm or more, for example. A phosphor according to the first embodiment may have an emission spectrum peak at a wavelength of 658 nm or less, for example.

A phosphor according to the first embodiment may have an excitation spectrum peak at a wavelength in the range of not less than 480 nm and not more than 550 nm. For example, a phosphor according to the first embodiment may have an excitation spectrum peak at a wavelength of 490 nm or more or an excitation spectrum peak at a wavelength of 496 nm or more. A phosphor according to the first embodiment may have an excitation spectrum peak at a wavelength of 525 nm or less, for example.

When the excitation spectrum peak at a wavelength in the range of not less than 480 nm and not more than 550 nm is referred to as a first excitation spectrum peak, a phosphor according to the first embodiment may further have a second excitation spectrum peak at a wavelength of 350 nm or more and less than 480 nm. The first or second excitation spectrum peak may be the maximum peak of the excitation spectrum.

The crystal phase in a phosphor according to the first embodiment may have a 1/e emission lifetime of 100 ns or less. The emission lifetime has an influence on the luminance saturation characteristics. Phosphors containing Eu, such as a known red phosphor CASN:Eu, have a longer emission lifetime than phosphors containing Ce. Thus, phosphors containing Eu are likely to reach luminance saturation due to a decrease in quantum efficiency during high-energy excitation. Thus, the phosphor with the Ce luminescent center of the first embodiment is expected to be a red phosphor with higher quantum efficiency than known red phosphors even in a high-power operation.

The base material of a phosphor according to the first embodiment may contain a tetragonal crystal. In other words, the crystal phase with the chemical composition $(Lu_xY_{1-x})_yM_{3-y-z}Ce_z\beta_p\gamma_q$ in a phosphor according to the first embodiment may have a tetragonal crystal structure. The crystal phase may have almost the same crystal structure as a crystal represented by the general formula $La_3Si_6N_{11}$.

The crystal phase in a phosphor according to the first embodiment may have a crystal structure in which Ce substitutes for at least part of the La(2a) sites in the $La_3Si_6N_{11}$ crystal structure. The crystal phase in a phosphor according to the first embodiment may have a crystal structure in which at least one selected from the group consisting of Lu and Y substitutes for at least part of the La(4c) sites in the $La_3Si_6N_{11}$ crystal structure or a crystal structure in which at least one selected from the group consisting of Lu and Y substitutes for a majority of the La(4c) sites in the $La_3Si_6N_{11}$ crystal structure.

As illustrated in FIG. 7, La in the $La_3Si_6N_{11}$ crystal structure has two coordination states: the La(2a) sites and the La(4c) sites. The La(2a) sites have high symmetry, and the La(4c) sites have low symmetry. For example, substitution of Ce with a large ionic radius for La at a La(2a) site with high symmetry decreases the enthalpy of formation by approximately 48 meV as determined by first principle calculation and is thermodynamically stable. From this standpoint, the crystal phase in a phosphor according to the first embodiment desirably has a crystal structure in which Ce substitutes for at least part of the La(2a) sites in the $La_3Si_6N_{11}$ crystal structure. Furthermore, for example, substitution of at least one selected from the group consisting of Lu and Y for La at a La(4c) site with low symmetry enlarges the splitting of the 5d orbital of Ce due to large lattice distortion. This decreases the energy difference between the 4f orbital and the 5d orbital and can cause a shift of the excitation wavelength and the emission wavelength to a longer wavelength. From this perspective, the crystal phase in a phosphor according to the first embodiment desirably has a crystal structure in which at least one selected from the group consisting of Lu and Y substitutes for at least part of the La(4c) sites in the $La_3Si_6N_{11}$ crystal structure. Furthermore, the crystal phase more desirably has a crystal structure in which at least one selected from the group consisting of Lu and Y substitutes for a majority of the La(4c) sites in the $La_3Si_6N_1$ crystal structure.

<Method for Producing Phosphor>

A method for producing a phosphor according to the first embodiment will be described below.

For example, a Ce compound, a La compound, a Si compound, a Lu compound, and a Y compound may be used as raw materials, or each of Ce, La, Si, Lu, and Y may be used as a raw material. The compound may be a compound that can be converted into a nitride by firing in a nitrogen atmosphere, a high-purity (purity of 99% or more) nitride, or a metal alloy. A small amount of fluoride (such as ammonium fluoride) may be added to promote the reaction.

For example, a Ce compound, a La compound, a Si compound, a Lu compound, and a Y compound may be prepared in such a manner as to satisfy the chemical composition $(Lu_xY_{1-x})_yM_{3-y-z}Ce_z\beta_p\gamma_q$. In the chemical composition, x, y, z, p, and q satisfy $0<x\le1$, $1.5\le y\le 3-z$, $0<z\le 0.6$, $5.5\le p\le 6.5$, and $10.5\le q\le 11.5$. The Si compound may be replaced by Si alone. Specific raw materials may be a $CeF_3$ powder, a LaN powder, a $Si_3N_4$ powder, a LuN powder, and an YN powder, for example. The $CeF_3$ powder may be replaced by a CeN powder. The $Si_3N_4$ powder may be replaced by a powder of Si alone. The amount of the LaN powder may be approximately 24% more than the theoretical value. LaN is likely to be decomposed during firing, and the addition of excess LaN in the preparation of the raw materials can reduce the production of by-product $LaSi_3N_5$ crystals.

A phosphor according to the first embodiment is produced by firing a mixture of the raw materials. The raw materials may be mixed by wet blending in a solution or by dry blending of dry powders. Industrially commonly used ball mills, medium stirring mills, planetary mills, vibrating mills, jet mills, V-type mixers, and agitators may be used. The firing is performed in a high-pressure nitrogen atmosphere at a temperature in the range of 1500° C. to 2000° C. for approximately 1 to 50 hours. The pressure is typically 3 atm or more, desirably 4 atm or more, more desirably 8 atm or more. After firing, the phosphor may be washed in a 10% nitric acid solution for 1 hour, for example. The resulting phosphor powder may be ground again in a ball mill or a jet mill and, if necessary, may be washed or classified to adjust the particle size distribution and flowability of the phosphor powder.

<Light-Emitting Apparatus Including Phosphor>

A phosphor according to the first embodiment can be used in light-emitting apparatuses. A light-emitting apparatus according to the present embodiment includes an excitation light source and a first phosphor. The excitation light source emits light at a wavelength of 600 nm or less. Upon irradiation with light emitted from the excitation light source, the first phosphor produces fluorescence with a longer wavelength than the light emitted from the excitation light source. The first phosphor is a phosphor according to the first embodiment, for example. Such components can constitute a light-emitting apparatus with high quantum efficiency even in a high-power operation.

Light from the excitation light source may have a wavelength in the range of not less than 480 nm and not more than 600 nm. A phosphor according to the first embodiment typically has an excitation spectrum peak at a wavelength in the range of not less than 480 nm and not more than 550 nm and can be efficiently excited with an excitation light source that emits light in this wavelength range. Light from the excitation light source may include light with a wavelength in the range of not less than 200 nm and not more than 480 nm or light with a wavelength in the range of not less than 420 nm and not more than 480 nm. A phosphor according to the first embodiment can also absorb excitation light at a wavelength of 480 nm or less. Light with a wavelength of less than 200 nm is attenuated by absorption by air. Thus, the excitation light source desirably emits light at a wavelength of 200 nm or more. The excitation light source is an LED or LD, for example.

A light-emitting apparatus according to the present embodiment may further include a second phosphor having an emission spectrum peak with a wavelength of 480 nm or more and less than 600 nm. More specifically, the light-emitting apparatus may include a combination of the first phosphor and the second phosphor. Upon irradiation with light emitted from the excitation light source, the second phosphor produces fluorescence with a longer wavelength than the light emitted from the excitation light source. The second phosphor may be a phosphor containing a crystal phase with the chemical composition $Y_3Al_5O_{12}:Ce$ (YAG:Ce) or a phosphor containing a crystal phase with the chemical composition $La_3Si_6N_{11}:Ce$ (LSN:Ce).

The second phosphor may be a phosphor that emits yellow light, for example. The light-emitting apparatus may include a third phosphor that emits green light. More specifically, the light-emitting apparatus may include a combination of the first phosphor, the second phosphor that emits yellow light, and the third phosphor that emits green light. Upon irradiation with light emitted from the excitation light source, the third phosphor produces fluorescence with a longer wavelength than the light emitted from the excitation light source. The third phosphor may be a phosphor containing a crystal phase with the chemical composition $Lu_3Al_5O_{12}:Ce$ (LuAG:Ce) or a phosphor containing a crystal phase with the chemical composition $Y_3(Al,Ga)_5N_{12}:Ce$ (YAGG:Ce). A phosphor according to the first embodiment may be excited by light emitted from the second phosphor and/or the third phosphor. The term "green light", as used herein, refers to light that satisfies the CIE chromaticity coordinates $0.1\le x\le 0.4$ and $0.5\le y\le 0.8$. The term "yellow light", as used herein, refers to light that satisfies the CIE chromaticity coordinates $0.4\le x\le 0.6$ and $0.4\le y\le 0.6$.

In a light-emitting apparatus including a phosphor according to the first embodiment, the excitation light source, the second phosphor, and the third phosphor can be freely chosen within the above ranges in accordance with the intended use of the light-emitting apparatus. Thus, a light-emitting apparatus including a phosphor according to the first embodiment is useful not only as a red-light-emitting apparatus but also as a white-light-emitting apparatus, for example. More specifically, an excitation light source that emits blue light, a phosphor that emits yellow light, and a red phosphor according to the present embodiment can be combined to provide a high-power light-emitting apparatus that can exhibit good color rendering properties or a high-power light-emitting apparatus that can emit light of the incandescent lamp color.

Second Embodiment

Figure 10:
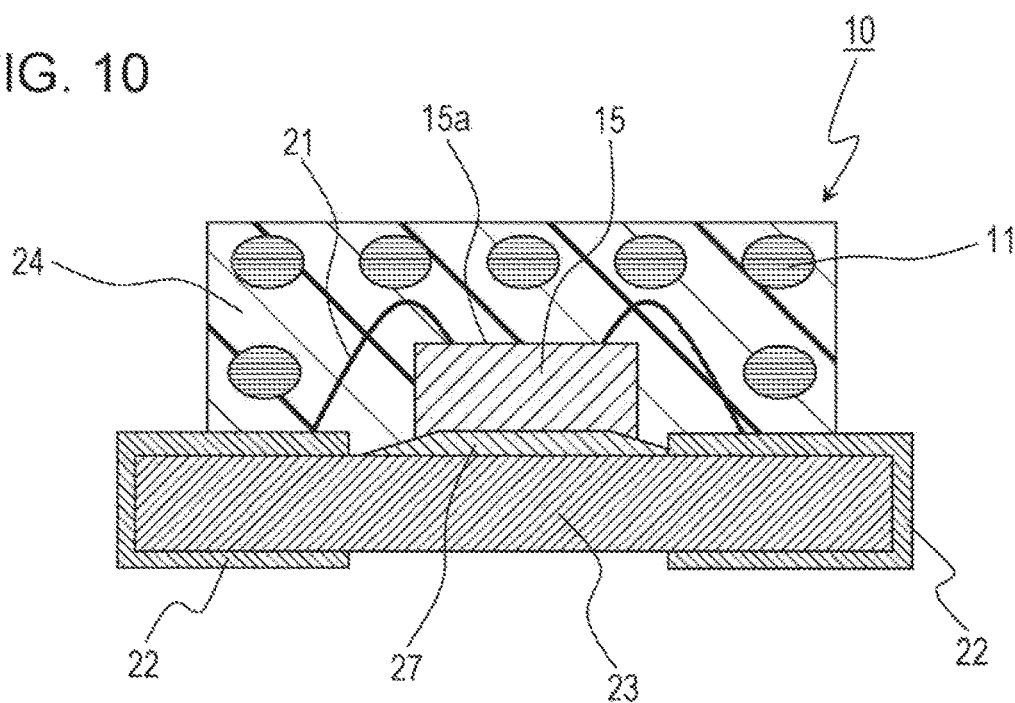
FIG. 10 is a schematic cross-sectional view of an LED light-emitting apparatus according to a second embodiment.

An LED light-emitting apparatus that includes a light-emitting device LED chip as a light source is described in a second embodiment as an example of a light-emitting apparatus according to the present disclosure. FIG. 10 is a schematic cross-sectional view of an LED light-emitting apparatus according to the second embodiment. As illustrated in FIG. 10, an LED light-emitting apparatus 10 includes a phosphor 11, an LED chip 15, and an LED sealing member 24. The LED light-emitting apparatus 10 may include a support 23. The support 23 supports the LED chip 15. In the present embodiment, the LED light-emitting apparatus 10 has a surface-mountable structure, and therefore the support 23 is a substrate.

The present embodiment can be applied to a high-brightness LED light-emitting apparatus. For example, the support 23 has high thermal conductivity so as to efficiently dissipate heat generated by the LED chip 15. For example, the support 23 may be a ceramic substrate formed of alumina or aluminum nitride.

For example, the LED chip 15 emits light in the ultraviolet to yellow region and has an emission spectrum peak at a wavelength in the range of 200 to 600 nm. More specifically, the LED chip 15 may be a yellow LED chip, a green LED chip, a blue LED chip, a blue-violet LED chip, a near-ultraviolet LED chip, or an ultraviolet LED chip. The LED chip 15 is fixed to the support 23, for example, with solder 27 such that an output surface 15a is not in contact with the support 23. The LED chip 15 is electrically connected to an electrode 22 on the support 23 via a bonding wire 21. The LED chip 15 is covered with the LED sealing member 24.

The LED sealing member 24 is formed of a silicone resin, for example. The phosphor 11 is dispersed in the LED sealing member 24. The silicone resin may be one of silicone resins with structures represented by various chemical formulae used as sealing resins in semiconductor light-emitting devices. The silicone resin contains color-fast dimethyl silicone, for example. Heat-resistant methylphenyl silicone may also be used as a silicone resin. The silicone resin may be a homopolymer with a siloxane-bonded main skeleton represented by one chemical formula. Alternatively, the silicone resin may be a copolymer with structural units containing a siloxane bond represented by two or more chemical formulae or may be an alloy of two or more silicone polymers.

In the present embodiment, the silicone resin in the LED sealing member 24 is in the cured state. Thus, the LED sealing member 24 is also in the cured state. As described below, the LED sealing member 24 can be produced from an uncured silicone resin. Typical silicone resins are of two-component type in which a main agent and a curing agent are mixed to promote curing. However, a thermosetting silicone resin or an energy-curable silicone resin, which can be cured by irradiation with energy, such as light, may also be used. The LED sealing member 24 may be formed of a material other than silicone resins. For example, glass, an epoxy resin, or an inorganic material composed of ZnO may be used. Instead of being dispersed in the LED sealing member 24, the phosphor 11 may be disposed in the form of a phosphor plate on the LED sealing member 24.

Although the LED chip is wire-bonded in the example, the LED chip used in the present embodiment may have another structure. More specifically, the LED chip used in the present embodiment may be face-up mounted or flip-chip mounted. The LED chip used in the present embodiment may include a light-emitting layer formed of a nitride semiconductor with a growth surface of a general polar plane (c plane).

<Outline of Phosphor>

The phosphor 11 absorbs part or all of the wavelength components of light in the near-ultraviolet to yellow region (for example, near-ultraviolet light) emitted from the LED chip 15 and produces fluorescence. The wavelength of light to be absorbed and the wavelength of fluorescence depend on the type of fluorescent material contained in the phosphor 11. The phosphor 11 may be a mixed phosphor containing different color phosphors so as to produce white light by color mixing. The phosphor 11 may be a mixed phosphor of a green phosphor and a red phosphor. The red phosphor is a phosphor according to the first embodiment.

Examples of the green phosphor include $M^{II}_2MgSi_2O_7$:$Eu^{2+}$ ($M^{II}$=at least one selected from Ba, Sr, and Ca), $SrSi_5AlO_2N_7$:$Eu^{2+}$, $SrSi_2O_2N_2$:$Eu^{2+}$, $BaAl_2O_4$:$Eu^{2+}$, $BaZrSi_3O_9$:$Eu^{2+}$, $M^{II}_2SiO_4$:$Eu^{2+}$ ($M^{II}$=at least one selected from Ba, Sr, and Ca), $BaSi_3O_4N_2$:$Eu^{2+}$, $Ca_8Mg(SiO_4)_4Cl_2$:$Eu^{2+}$, $Ca_3SiO_4Cl_2$:$Eu^{2+}$, and β-SiAlON:$Eu^{2+}$ phosphors.

In another embodiment, the phosphor 11 may be a mixed phosphor of a yellow phosphor and a red phosphor. The red phosphor is a phosphor according to the first embodiment. Examples of the yellow phosphor include $Y_3Al_5O_{12}$:$Ce^{3+}$, $CaSi_2O_2N_2$:$Eu^{2+}$, (Ba, Sr)$Si_2O_2N_2$:$Eu^{2+}$, $Ca_3Sc_2Si_3O_{12}$:$Ce^{3+}$, $CaSc_2O_4$:$Ce^{3+}$, α-SiAlON:$Eu^{2+}$, and $La_3Si_6N_{11}$:$Ce^{3+}$ phosphors.

The phosphor 11 has a particle size in the range of 1 to 80 μm, for example. The term "particle size", as used herein, refers to the equivalent circular diameter determined by microscopy.

For example, the LED sealing member 24 contains 3 to 70 parts by weight of the phosphor 11 per 100 parts by weight of the sealing member. At least 3 parts by weight of the phosphor 11 can produce fluorescence of sufficient intensity and provide the LED light-emitting apparatus 10 that emits light of a desired wavelength. The weight ratio of color phosphors in the phosphor 11 depends on the desired color tone of white light and the emission intensity of each color phosphor. The LED light-emitting apparatus can also be configured to produce a color other than white by using the phosphor 11 composed of the red phosphor of the first embodiment alone or in combination with another color phosphor.

The phosphors other than the red phosphor according to the first embodiment can be produced by a known method. More specifically, a raw material used to produce an oxide phosphor may be a compound that forms an oxide by firing, such as a hydroxide, oxalate, or nitrate, or may be an oxide. A small amount of fluoride (for example, calcium fluoride) or chloride (for example, calcium chloride) may be added to promote the reaction. A phosphor is produced by firing a mixture of the raw materials.

The raw materials may be mixed by wet blending in a solvent or by dry blending of dry powders. Industrially commonly used ball mills, medium stirring mills, planetary mills, vibrating mills, jet mills, V-type mixers, and agitators may be used. The phosphor raw materials are fired in the air or in a reducing atmosphere at a temperature in the range of 1100° C. to 1700° C. for approximately 1 to 50 hours. The firing furnace may be an industrially commonly used furnace. For example, a continuous or batch-wise electric furnace or gas furnace, such as a pusher furnace, or a high-pressure furnace of spark plasma sintering (SPS) or hot isostatic pressing (HIP) sintering may be used. The resulting phosphor powder may be ground again in a ball mill or a jet mill and, if necessary, may be washed or classified to adjust the particle size distribution and flowability of the phosphor powder.

Third Embodiment

Figure 11:
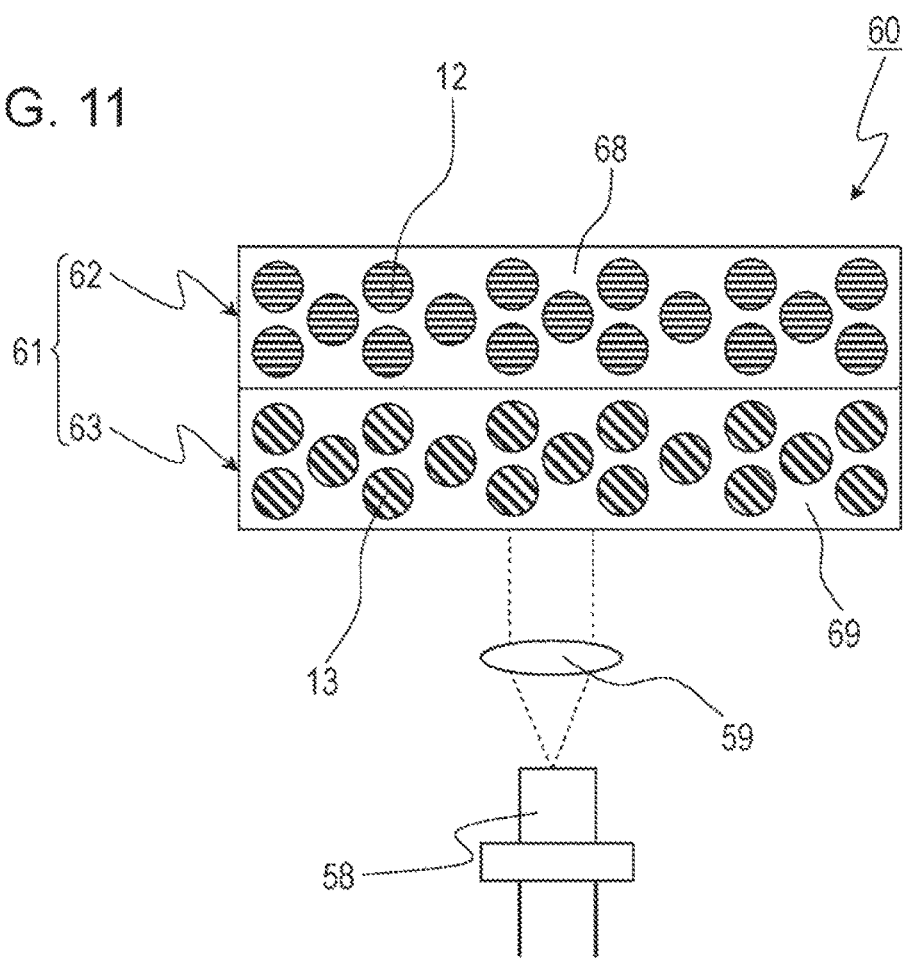
FIG. 11 is a schematic cross-sectional view of an LD light-emitting apparatus according to a third embodiment.

An LD light-emitting apparatus that includes a light-emitting device LD as a light source is described in a third embodiment as an example of a light-emitting apparatus of the present disclosure. FIG. 11 schematically illustrates an LD light-emitting apparatus 60 according to the third embodiment. The LD light-emitting apparatus 60 includes an LD device 58 and a wavelength convertor 61. The wavelength convertor 61 contains a phosphor. The phosphor converts output light emitted from the LD device 58 to light with a longer wavelength.

The LD device 58 can emit light with a higher light power density than LEDs. Thus, the LD device 58 can constitute the LD light-emitting apparatus 60 with high power. In order to increase the power of the LD light-emitting apparatus 60, the light power density of the LD device 58 to irradiate the phosphor is 0.5 W/mm$^2$ or more, for example. The light power density for irradiation of the phosphor may be 2 W/mm$^2$ or more, 3 W/mm$^2$ or more, or 10 W/mm$^2$ or more. However, an excessively high light power density for irradiation of the phosphor may result in an increased amount of heat generation by the phosphor and may adversely affect the LD light-emitting apparatus 60. Thus, the light power density for irradiation of the phosphor may be 150 W/mm$^2$ or less, 100 W/mm$^2$ or less, 50 W/mm$^2$ or less, or 20 W/mm$^2$ or less.

The LD device 58 may be any LD device that emits light of a wavelength capable of exciting the phosphor. For example, an LD device that emits blue-violet light, an LD device that emits blue light, an LD device that emits green light, or an LD device that emits yellow light can be used. In the present embodiment, the LD device 58 emits blue light. In the present specification, blue light has a peak wavelength of 420 nm or more and less than 480 nm. The LD device 58, which emits blue light, usually has higher luminous efficiency than LD devices that emit ultraviolet light, and has highest luminous efficiency at an emission peak wavelength of 445 nm. The LD device 58 may have an emission peak wavelength of 425 nm or more or 430 nm or more. The LD device 58 may have an emission peak wavelength of 475 nm or less or 470 nm or less.

The LD device 58 may be composed of one LD or optically coupled LDs. For example, the LD device 58 may include a light-emitting layer formed of a nitride semiconductor with a growth surface of a nonpolar plane or semipolar plane.

A phosphor in the wavelength convertor 61 contains a red phosphor according to the first embodiment. The wavelength convertor 61 may further contain a phosphor other than the red phosphor according to the first embodiment depending on the desired emission color of the light-emitting apparatus. For example, when the wavelength convertor 61 further contains a yellow phosphor and a green phosphor, the LD light-emitting apparatus 60 can be a white-light-emitting apparatus. The yellow phosphor and the green phosphor may be those exemplified in the second embodiment. The wavelength convertor 61 may be a wavelength conversion layer containing a mixture of phosphors or may be at least two wavelength conversion layers each containing one or more phosphors. In the present embodiment, the wavelength convertor 61 includes a first phosphor layer 62 containing a red phosphor 12 and a second phosphor layer 63 containing a yellow phosphor 13.

The first phosphor layer 62 and the second phosphor layer 63 contain binders 68 and 69, respectively. The binders 68 and 69 may be a medium such as a resin, glass, or transparent crystal. The binders 68 and 69 may be the same material or different materials. Each phosphor layer may be composed of phosphor particles alone.

An incident optical system 59 for directing light from the LD device 58 to the second phosphor layer 63 may be disposed between the wavelength convertor 61 and the LD device 58. The incident optical system 59 includes a lens, a mirror, or an optical fiber, for example.

The operation of the LD light-emitting apparatus 60 will be described below. Blue light emitted from the LD device 58 is incident on the second phosphor layer 63 of the wavelength convertor 61 through the incident optical system 59. The incident light excites the yellow phosphors 13 in the second phosphor layer 63 and induces the emission of yellow light. Blue light emitted from the LD device 58 and passing through the second phosphor layer 63 without absorption is incident on the first phosphor layer 62. The incident light excites the red phosphors 12 in the first phosphor layer 62 and induces the emission of red light. The yellow light emitted from the second phosphor layer 63 is incident on the first phosphor layer 62. Part of the incident light may excite the red phosphors 12 in the first phosphor layer 62 and induce the emission of red light. Blue light emitted from the LD device 58 and passing through the first phosphor layer 62 and the second phosphor layer 63 without absorption is emitted outward. These red light, yellow light, and blue light are mixed to produce white light.

The thickness of each phosphor layer may be adjusted such that blue light emitted from the LD device 58 does not pass through the first phosphor layer 62. The thickness of each phosphor layer may also be adjusted such that yellow light emitted from the second phosphor layer 63 does not pass through the first phosphor layer 62. In this case, only red light is emitted outward. In another embodiment, the yellow phosphor 13 in the second phosphor layer 63 may be replaced by the green phosphor described in the second embodiment.

Fourth Embodiment

Figure 12:
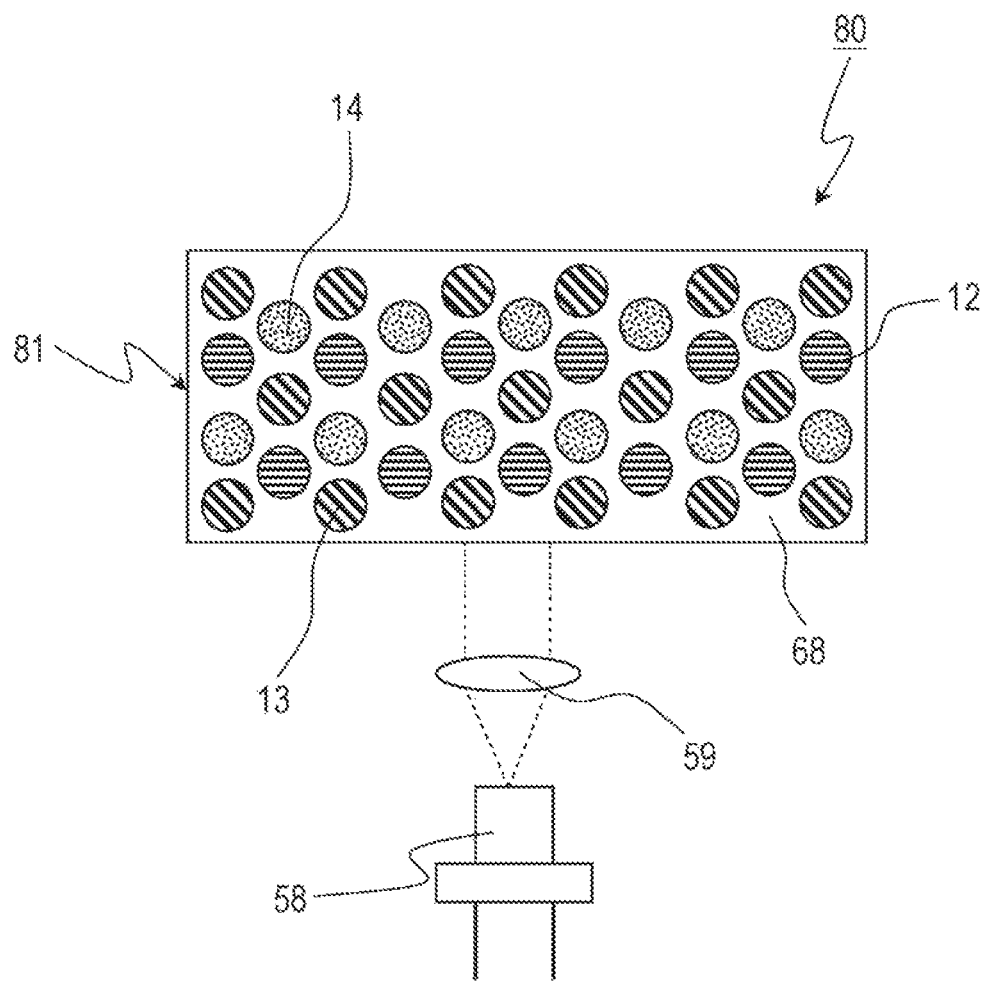
FIG. 12 is a schematic cross-sectional view of an LD light-emitting apparatus according to a fourth embodiment.

An LD light-emitting apparatus that includes a light-emitting device LD as a light source is described in a fourth embodiment as an example of a light-emitting apparatus of the present disclosure. FIG. 12 schematically illustrates an LD light-emitting apparatus 80 according to the fourth embodiment. The components described in the third embodiment are denoted by the same reference numerals in the present embodiment and will not be described again. The LD light-emitting apparatus 80 includes the LD device 58 and a wavelength convertor 81.

The wavelength convertor 81 contains a phosphor. The phosphor converts output light emitted from the LD device 58 to light with a longer wavelength. The phosphor in the wavelength convertor 81 includes a wavelength conversion layer containing a mixture of the red phosphor 12 and at least one selected from the group consisting of the yellow phosphor 13 and a green phosphor 14. The red phosphor 12 is a phosphor according to the first embodiment. The yellow phosphor and the green phosphor may be those exemplified in the second embodiment. In the present embodiment, the wavelength convertor 81 is a phosphor layer containing a mixture of the red phosphor 12, the yellow phosphor 13, and the green phosphor 14. The mixing ratio of the three phosphors can be appropriately adjusted according to the desired color tone of white light and the emission intensity of each phosphor.

The phosphor layer of the wavelength convertor 81 contains a binder 68. The binder 68 may be a medium such as a resin, glass, or transparent crystal. The binder 68 may be of uniform quality or of different qualities at different portions. The phosphor layer may be composed of phosphor particles alone.

Blue light emitted from the LD device 58 and passing through the incident optical system 59 is converted to red light, yellow light, and green light by the red phosphor 12, the yellow phosphor 13, and the green phosphor 14, respectively, in the wavelength convertor 81. Blue light emitted from the LD device 58 and not absorbed by the phosphors, red light converted by the red phosphor 12, yellow light converted by the yellow phosphor 13, and green light converted by the green phosphor 14 are mixed to produce white light. The red phosphor 12 is excited by part of green light emitted from the green phosphor 14 and emits red light.

As described above, due to a red phosphor according to the first embodiment, the light-emitting apparatuses according to the second to fourth embodiments can have higher quantum efficiency than before in a high-power operation. Furthermore, these lighting apparatuses configured as white-light-emitting apparatuses can exhibit good color rendering properties and color reproducibility.

Fifth Embodiment

Figure 13:
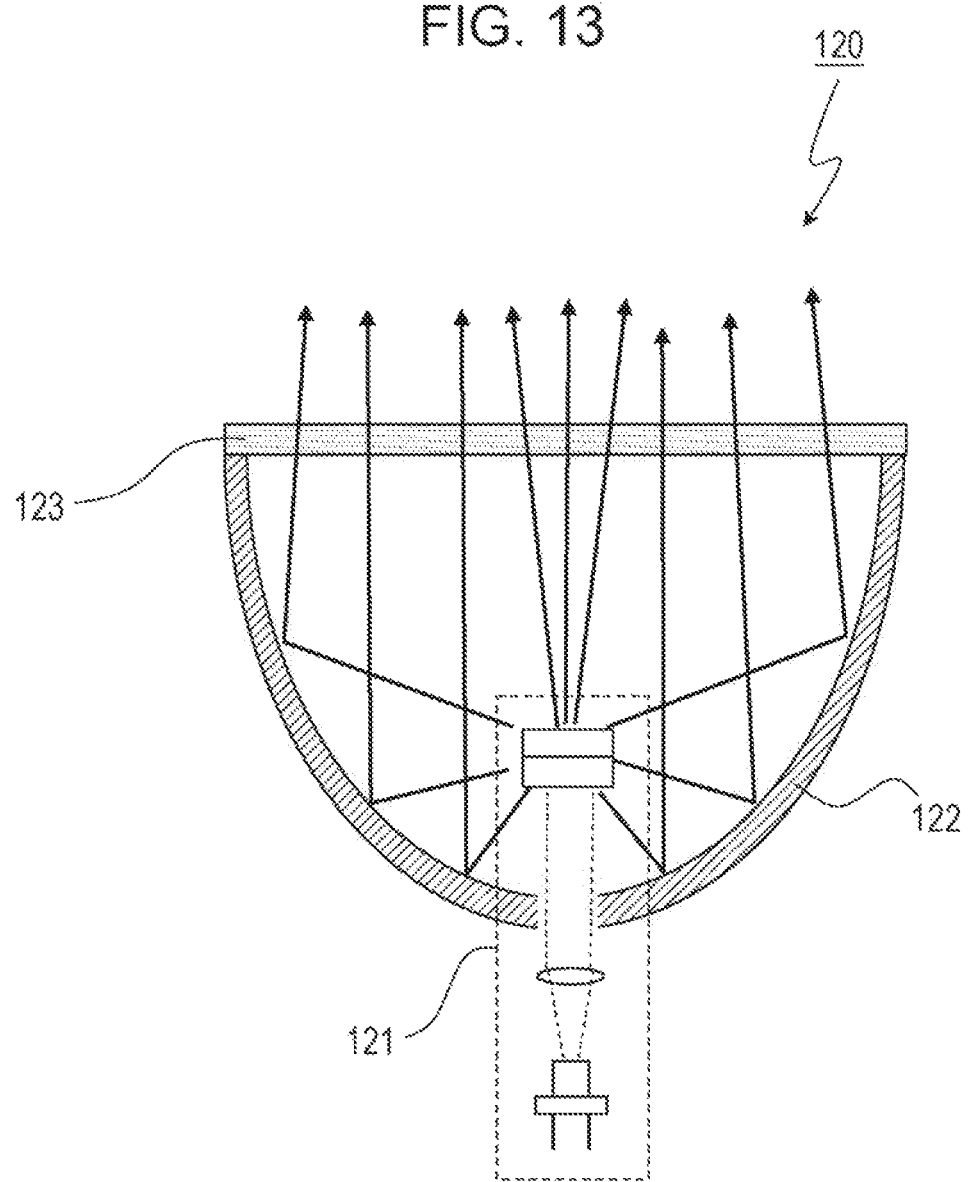
FIG. 13 is a schematic cross-sectional view of a lighting apparatus according to a fifth embodiment.

An example of a lighting apparatus of the present disclosure is described in a fifth embodiment. FIG. 13 schematically illustrates a lighting apparatus 120 according to the fifth embodiment. The lighting apparatus 120 includes a light source 121 and an output optical system 122 for directing light from the light source 121 forward. In order to adjust the color of light emitted from the light source, the lighting apparatus 120 may include a wavelength cut filter 123 for absorbing or reflecting light emitted from the light source. The light source 121 includes a red phosphor according to the first embodiment. The light source 121 may be one of the light-emitting apparatuses 10, 60, and 80 of the second to fourth embodiments. The output optical system 122 may be a reflector, for example. The output optical system 122 may include a metal film, such as Al or Ag, or an Al film with a surface protective film, for example.

Due to a red phosphor according to the first embodiment, a lighting apparatus according to the fifth embodiment can have higher quantum efficiency than known lighting apparatuses in a high-power operation. Furthermore, a lighting apparatus of the present embodiment configured as a white-light illumination apparatus can exhibit good color rendering properties and color reproducibility.

Sixth Embodiment

Figure 14:
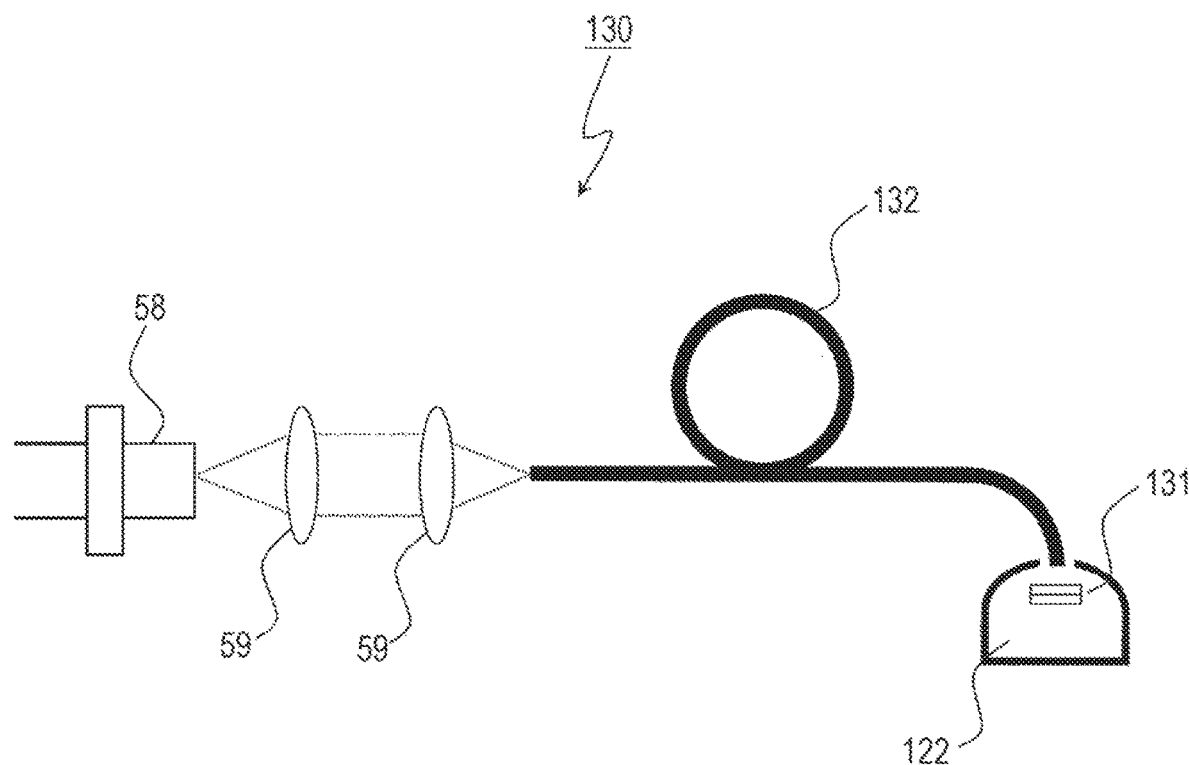
FIG. 14 is a schematic cross-sectional view of a lighting apparatus according to a sixth embodiment.

A lighting apparatus including an optical fiber is described in a sixth embodiment as an example of a lighting apparatus according to the present disclosure. FIG. 14 schematically illustrates a lighting apparatus 130 according to the sixth embodiment. The lighting apparatus 130 includes the LD device 58, the incident optical system 59, an optical fiber 132, a wavelength convertor 131, and an output optical system 122.

Light from the LD device 58 is directed to the optical fiber 132 through the incident optical system 59. The optical fiber 132 directs the light to an output portion. The output portion includes the wavelength convertor 131 and the output optical system 122, for example. The wavelength convertor 61 contains a red phosphor according to the first embodiment. The wavelength convertor 131 may be the wavelength convertor 61 or 81 according to the third or fourth embodiment. Although the wavelength convertor 131 may be closer to the output surface than the optical fiber 132, as illustrated in FIG. 14, the wavelength convertor 131 may be closer to the incident surface than the optical fiber 132 (for example, between the LD device 58 and the incident optical system 59 or between the incident optical system 59 and the optical fiber 132).

The lighting apparatus according to the sixth embodiment can easily change the emission direction with the optical fiber.

A red phosphor according to the first embodiment can improve the quantum efficiency in a high-power operation compared with the quantum efficiency of known lighting apparatuses. Furthermore, a lighting apparatus of the present embodiment configured as a white-light illumination apparatus can exhibit good color rendering properties and color reproducibility.

Seventh Embodiment

Figure 15:
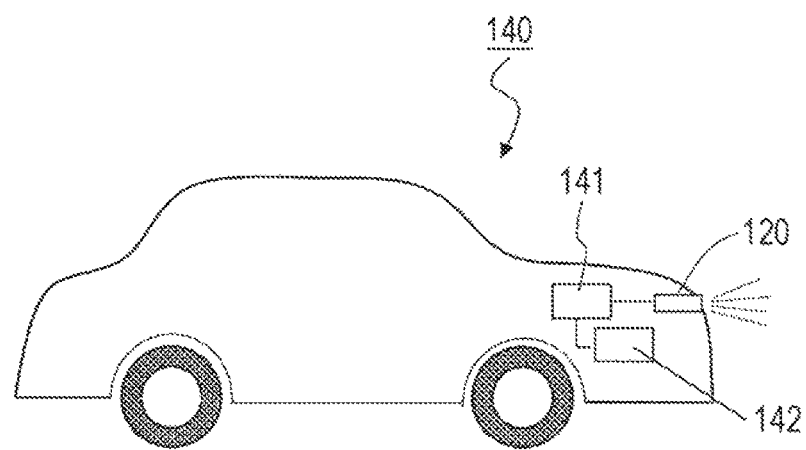
FIG. 15 is a schematic cross-sectional view of a vehicle according to a seventh embodiment.

A vehicle including a lighting apparatus is described in a seventh embodiment as an application example of a lighting apparatus according to the present disclosure. FIG. 15 schematically illustrates a vehicle 140 according to the seventh embodiment. The vehicle 140 includes a vehicle headlight, which is the lighting apparatus 120 according to the fifth embodiment, and a power supply source 141. The vehicle 140 may include an electric generator 142, which is rotated by a driving source, such as an engine, and generates electric power. Electric power generated by the electric generator 142 may be stored in the power supply source 141. The power supply source 141 may be a rechargeable secondary battery. The lighting apparatus 120 turns on a light using electric power supplied from the power supply source 141. The vehicle 140 is an automobile, a two-wheeled vehicle, or a special-purpose vehicle, for example. The vehicle 140 may also be a combustion engine vehicle, an electric vehicle, or a hybrid vehicle.

In the vehicle according to the seventh embodiment, the vehicle headlight including a red phosphor according to the first embodiment can illuminate an area in front of the vehicle more brightly than before in a high-power operation. Furthermore, a lighting apparatus of the present embodiment configured as a white-light illumination apparatus can exhibit good color rendering properties and color reproducibility.

A phosphor according to the present disclosure is useful in a light-emitting apparatus, for example. For example, a phosphor according to the present disclosure can be used in a light source in a general lighting apparatus, such as a ceiling light, a special lighting apparatus, such as a spotlight, stadium illumination, or studio illumination, a vehicle lighting apparatus, such as a headlight, a projection apparatus, such as a projector or a head-up display, an image pickup apparatus, such as an endoscopic light, a digital camera, a mobile phone, or a smartphone, or a liquid crystal display unit, such as a personal computer (PC) monitor, a laptop computer, a television set, a personal digital assistant (PDA), a smartphone, a tablet PC, or a mobile phone.

What is claimed is:

1. A phosphor comprising a crystal phase with a chemical composition $(Lu_xY_{1-x})_yM_{3-y-z}Ce_z\beta_p\gamma_q$, where M includes La and optionally one or more elements selected from the group consisting of Sc, Pr, Nd, Sm, Eu, Gd, Tb, Dy, Ho, Er, Tm, and Yb, $\beta$ contains Si, which constitutes 90% or more by mole of $\beta$, $\gamma$ contains N, which constitutes 90% or more by mole of $\gamma$, and y, z, p, and q satisfy $2 \leq y \leq 3-z$, $0 < z \leq 0.6$, $5.5 \leq p \leq 6.5$, and $10.5 \leq q \leq 11.5$, wherein the phosphor has an emission spectrum peak at a wavelength in a range of not less than 600 nm and not more than 680 nm.

2. The phosphor according to claim 1, wherein the phosphor has an excitation spectrum peak at a wavelength in a range of not less than 480 nm and not more than 550 nm.

3. The phosphor according to claim 2, wherein
the excitation spectrum peak is a first excitation spectrum peak, and
the phosphor has a second excitation spectrum peak at a wavelength of 350 nm or more and less than 480 nm.

4. The phosphor according to claim 1, wherein M contains La, which constitutes 90% or more by mole of M.

5. The phosphor according to claim 4, wherein M denotes La,
β denotes Si, and
γ denotes N.

6. The phosphor according to claim 1, wherein the crystal phase has a tetragonal crystal structure.

7. The phosphor according to claim 1, wherein the crystal phase has a 1/e emission lifetime of 100 ns or less.

8. The phosphor according to claim 1, wherein the crystal phase has a crystal structure in which Ce substitutes for at least part of La(2a) sites in a $La_3Si_6N_{11}$ crystal structure.

9. The phosphor according to claim 1, wherein the crystal phase has a crystal structure in which Lu substitutes for a majority of La(4c) sites in the $La_3SiN_{11}$ crystal structure.

10. A light-emitting apparatus comprising:
an excitation light source that emits light with a wavelength of 600 nm or less, and
a first phosphor, which is the phosphor according to claim 1,
wherein the phosphor is irradiated with the light emitted from the excitation light source and produces fluorescence at a longer wavelength than the light.

11. The light-emitting apparatus according to claim 10, wherein the wavelength of the light emitted from the excitation light source is in a range of not less than 480 nm and not more than 600 nm.

12. The light-emitting apparatus according to claim 10, wherein the wavelength of the light emitted from the excitation light source is in a range of not less than 420 nm and not more than 480 nm.

13. The light-emitting apparatus according to claim 10, wherein the excitation light source is a light-emitting diode (LED) or a laser diode (LD).

14. The light-emitting apparatus according to claim 10, further comprising: a second phosphor that is irradiated with the light emitted from the excitation light source and produces second fluorescence at a longer wavelength than the light,
wherein the second phosphor has an emission spectrum peak at a wavelength of 480 nm or more and less than 600 nm.

15. The light-emitting apparatus according to claim 14, wherein
the second phosphor is a phosphor that emits yellow light as the second fluorescence,
the light-emitting apparatus further includes a third phosphor that is irradiated with the light emitted from the excitation light source and that produces third fluorescence at a longer wavelength than the light, and
the third phosphor emits green light as the third fluorescence.

16. A phosphor comprising a crystal phase with a chemical composition $(Lu_xY_{1-x})_yM_{3-y-z}Ce_z\beta_p\gamma_q$,
where M denotes one or more elements selected from the group consisting of La, Sc, Pr, Nd, Sm, Eu, Gd, Tb, Dy, Ho, Er, Tm, and Yb,
β contains Si, which constitutes 90% or more by mole of β,
γ contains N, which constitutes 90% or more by mole of γ, and
x, y, z, p, and q satisfy $0<x<1$, $2\leq y\leq 3-z$, $0<z\leq 0.6$, $5.5\leq p\leq 6.5$, and $10.5\leq q\leq 11.5$,
wherein the phosphor has an emission spectrum peak at a wavelength in a range of not less than 600 nm and not more than 680 nm.

17. The phosphor according to claim 16, wherein y and z satisfy $y=3-z$.

18. The phosphor according to claim 16, wherein
β denotes Si, and
γ denotes N.

19. A light-emitting apparatus comprising:
an excitation light source that emits light with a wavelength of 600 nm or less, and
a first phosphor, which is the phosphor according to claim 16,
wherein the phosphor is irradiated with the light emitted from the excitation light source and produces fluorescence at a longer wavelength than the light.

* * * * *